US011419212B2

United States Patent
Xiong et al.

(10) Patent No.: US 11,419,212 B2
(45) Date of Patent: Aug. 16, 2022

(54) FLEXIBLE PRINTED CIRCUIT AND MANUFACTURING METHOD THEREOF, ELECTRONIC DEVICE MODULE AND ELECTRONIC DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Ren Xiong, Beijing (CN); Qiang Tang, Beijing (CN)

(73) Assignees: Chengdu BOE Optoelectronics Technology Co., Ltd., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 175 days.

(21) Appl. No.: 16/958,937

(22) PCT Filed: Jan. 23, 2020

(86) PCT No.: PCT/CN2020/073940
§ 371 (c)(1),
(2) Date: Jun. 29, 2020

(87) PCT Pub. No.: WO2020/156475
PCT Pub. Date: Aug. 6, 2020

(65) Prior Publication Data
US 2021/0219423 A1 Jul. 15, 2021

(30) Foreign Application Priority Data

Jan. 30, 2019 (CN) .......................... 201910093341.0
Jan. 22, 2020 (CN) .......................... 202010075431.X

(51) Int. Cl.
*H05K 1/00* (2006.01)
*H05K 1/11* (2006.01)
(Continued)

(52) U.S. Cl.
CPC ........... *H05K 1/118* (2013.01); *H05K 1/0237* (2013.01); *H05K 1/111* (2013.01); *H05K 1/189* (2013.01);
(Continued)

(58) Field of Classification Search
CPC ...... H05K 1/118; H05K 1/0237; H05K 1/111; H05K 1/189; H05K 3/3457; H05K 3/361;
(Continued)

(56) References Cited

U.S. PATENT DOCUMENTS 6,296,494 B1   10/2001  Yuasa et al.
8,383,948 B2   2/2013   Aoyama et al.
(Continued)

FOREIGN PATENT DOCUMENTS

CN       102026480 A      4/2011
CN       103135837 A      6/2013
(Continued)

OTHER PUBLICATIONS

International Search Report of PCT/CN2020/073940 in Chinese, dated Apr. 10, 2020 with English translation.
(Continued)

*Primary Examiner* — Andargie M Aychillhum
(74) *Attorney, Agent, or Firm* — Collard & Roe, P.C.

(57) ABSTRACT

A flexible printed circuit and a manufacturing method thereof, an electronic device module and an electronic device are provided. The flexible printed circuit includes a main sub-circuit board and a bridge sub-circuit board; the main sub-circuit board includes a first substrate, and a first bridge end, a second bridge end, a first wiring portion, and a second wiring portion on the first substrate; the bridge sub-circuit board includes a second substrate, and a third bridge end, a fourth bridge end, and a third wiring portion on the second substrate, the third bridge end and the fourth
(Continued)

bridge end are electrically connected by the third wiring portion, and the bridge sub-circuit board is configured to be mounted on the main sub-circuit board by electrically connecting the third bridge end and the fourth bridge end to the first bridge end and the second bridge end, respectively.

20 Claims, 12 Drawing Sheets

(51) Int. Cl.
  *H05K 1/02* (2006.01)
  *H05K 1/18* (2006.01)
  *H05K 3/34* (2006.01)
  *H05K 3/36* (2006.01)
  *H05K 3/46* (2006.01)
(52) U.S. Cl.
  CPC ........... *H05K 3/3457* (2013.01); *H05K 3/361* (2013.01); *H05K 3/4644* (2013.01); *H05K 2201/0715* (2013.01); *H05K 2201/10128* (2013.01)
(58) Field of Classification Search
  CPC ......... H05K 3/4644; H05K 2201/0715; H05K 2201/10128
  USPC ........................................... 174/254
  See application file for complete search history.

(56) References Cited

U.S. PATENT DOCUMENTS

| | | | |
|---|---|---|---|
| 8,822,833 | B2 | 9/2014 | Hsu et al. |
| 9,431,333 | B2 | 8/2016 | Rokugawa |
| 9,930,778 | B2 | 3/2018 | Ito et al. |
| 10,944,145 | B2 | 3/2021 | Baba et al. |
| 2001/0052423 | A1 | 12/2001 | Achari et al. |
| 2002/0131258 | A1 | 9/2002 | Inoue et al. |
| 2008/0102656 | A1 | 5/2008 | Lin et al. |
| 2011/0067904 | A1 | 3/2011 | Aoyama et al. |
| 2016/0270224 | A1 | 9/2016 | Ito et al. |
| 2016/0286649 | A1 | 9/2016 | Choi |
| 2017/0196080 | A1 | 7/2017 | Meng et al. |
| 2019/0079620 | A1 | 3/2019 | Yoshida |

FOREIGN PATENT DOCUMENTS

| | | |
|---|---|---|
| CN | 105246247 A | 1/2016 |
| CN | 105263262 A | 1/2016 |
| CN | 105632382 A | 6/2016 |
| CN | 106465541 A | 2/2017 |
| CN | 108012408 A | 5/2018 |
| CN | 108012458 A | 5/2018 |
| CN | 207410590 U | 5/2018 |
| CN | 108112157 A | 6/2018 |
| CN | 109067015 A | 12/2018 |
| CN | 109213387 A | 1/2019 |
| CN | 208621794 U | 3/2019 |
| CN | 105960091 A | 9/2019 |
| CN | 110413156 A | 11/2019 |
| CN | 110493949 A | 11/2019 |
| EP | 2 931 009 A1 | 10/2015 |
| JP | H10-321978 A | 12/1998 |
| TW | 479443 B | 3/2002 |

OTHER PUBLICATIONS

Notice of Transmittal of the International Search Report of PCT/CN2020/073940 in Chinese, dated Apr. 10, 2020.

Written Opinion of the International Searching Authority of PCT/CN2020/073940 in Chinese, dated Apr. 10, 2020.

Chinese Prior Art Search Report from the Patent Examination Cooperation Jiangsu Center of the Patent Office, CNIPA, Suzhou Huigu Intellectual Property Service Co. Ltd, with English Translation, dated Mar. 26, 2020.

Chinese Office Action in Chinese Application No. 202010075431 X, dated Mar. 12, 2021 with English translation.

U.S. Office Action in U.S. Appl. No. 17/418,771 dated Mar. 16, 2022.

FLEXIBLE PRINTED CIRCUIT AND MANUFACTURING METHOD THEREOF, ELECTRONIC DEVICE MODULE AND ELECTRONIC DEVICE

CROSS-REFERENCE TO RELATED APPLICATION

This application is the National Stage of PCT/CN2020/073940 filed on Jan. 23, 2020, which claims priority under 35 U.S.C. § 119 of Chinese Application No. 201910093341.0 filed on Jan. 30, 2019 and Chinese Application No. 202010075431.X filed on Jan. 22, 2020, the disclosures of which is incorporated by reference.

TECHNICAL FIELD

Embodiments of the present disclosure relate to a flexible printed circuit and a manufacturing method thereof, an electronic device module and an electronic device.

BACKGROUND

A flexible printed circuit (FPC) is a kind of printed circuit board with high reliability and flexibility, and is made of a flexible film as a base material. The flexible printed circuit has the characteristics of high wiring density, light weight, thin thickness, good bendability, etc., and is widely used in various electronic devices such as mobile phones, computers, and monitors.

SUMMARY

At least one embodiment of the present disclosure provides a flexible printed circuit, and the flexible printed circuit comprises: a main sub-circuit board, comprising a first substrate, and a first bridge end, a second bridge end, a first wiring portion, and a second wiring portion on the first substrate, the first wiring portion and the second wiring portion being spaced apart from each other and being electrically connected to the first bridge end and the second bridge end, respectively; and a bridge sub-circuit board, comprising a second substrate, and a third bridge end, a fourth bridge end, and a third wiring portion for a first functional wiring line on the second substrate, the third bridge end and the fourth bridge end being electrically connected by the third wiring portion; in which the first substrate and the second substrate are not in direct contact, and the bridge sub-circuit board is configured to be mounted on the main sub-circuit board by electrically connecting the third bridge end and the fourth bridge end to the first bridge end and the second bridge end, respectively.

For example, in the flexible printed circuit provided by at least one embodiment of the present disclosure, the bridge sub-circuit board is mounted on the main sub-circuit board, and the first wiring portion, the third wiring portion, and the second wiring portion are electrically connected in sequence to obtain the first functional wiring line.

For example, the flexible printed circuit provided by at least one embodiment of the present disclosure further comprises a first control circuit combination structure, the first control circuit combination structure is on the main sub-circuit board and is electrically connected to the first wiring portion, or the first control circuit combination structure is on the bridge sub-circuit board and is electrically connected to the third wiring portion; the first control circuit combination structure is configured to provide a first electrical signal to the first functional wiring line or receive a first electrical signal from the first functional wiring line.

For example, in the flexible printed circuit provided by at least one embodiment of the present disclosure, the main sub-circuit board further comprises a second functional wiring line, the second functional wiring line is electrically connected to the first control circuit combination structure on the main sub-circuit board, and the first control circuit combination structure is further configured to provide a second electrical signal to the second functional wiring line or receive a second electrical signal from the second functional wiring line.

For example, in the flexible printed circuit provided by at least one embodiment of the present disclosure, the main sub-circuit board further comprises a third functional wiring line, and the third functional wiring line is between the first wiring portion and the second wiring portion, and crosses the bridge sub-circuit board mounted on the main sub-circuit board.

For example, in the flexible printed circuit provided by at least one embodiment of the present disclosure, the first wiring portion, the second wiring portion, and the third functional wiring line are routed in a same direction.

For example, in the flexible printed circuit provided by at least one embodiment of the present disclosure, the main sub-circuit board comprises a first main wiring layer on a first side of the first substrate and a first main insulation layer stacked on a side of the first main wiring layer away from the first substrate, the first main wiring layer comprises the first wiring portion, the second wiring portion, the first bridge end, and the second bridge end, and the first bridge end and the second bridge end are exposed by the first main insulation layer.

For example, in the flexible printed circuit provided by at least one embodiment of the present disclosure, the main sub-circuit board further comprises a second main wiring layer, on a second side of the first substrate opposite to the first side, and a second main insulation layer stacked on a side of the second main wiring layer away from the first substrate, the second main wiring layer comprises the first wiring portion and the second wiring portion.

For example, in the flexible printed circuit provided by at least one embodiment of the present disclosure, the main sub-circuit board comprises a first main wiring layer on a first side of the first substrate and a first main insulation layer stacked on a side of the first main wiring layer away from the first substrate, the main sub-circuit board further comprises a second main wiring layer, on a second side of the first substrate opposite to the first side, and a second main insulation layer stacked on a side of the second main wiring layer away from the first substrate, the first main wiring layer comprises the first wiring portion, the second wiring portion, and the first bridge end, the first bridge end is exposed by the first main insulation layer; the second main wiring layer comprises the first wiring portion, the second wiring portion, and the second bridge end, and the second bridge end is exposed by the second main insulation layer.

For example, in the flexible printed circuit provided by at least one embodiment of the present disclosure, the bridge sub-circuit board comprises a first bridge wiring layer on a first side of the second substrate and a first bridge insulation layer stacked on a side of the first bridge wiring layer away from the second substrate, and the first bridge wiring layer comprises the third wiring portion.

For example, in the flexible printed circuit provided by at least one embodiment of the present disclosure, the bridge sub-circuit board further comprises a grounded layer on a second side of the second substrate opposite to the first side, and in a case where the bridge sub-circuit board is mounted on the main sub-circuit board, the second side is closer to the main sub-circuit board than the first side.

For example, in the flexible printed circuit provided by at least one embodiment of the present disclosure, the bridge sub-circuit board further comprises a shield layer on the second side of the second substrate, and the shield layer is stacked on a side of the grounded layer away from the second substrate.

For example, in the flexible printed circuit provided by at least one embodiment of the present disclosure, the bridge sub-circuit board further comprises a second bridge wiring layer on a second side of the second substrate opposite to the first side, and a second bridge insulation layer stacked on a side of the second bridge wiring layer away from the second substrate, the second bridge wiring layer comprises the third wiring portion, the third bridge end, and the fourth bridge end, the third bridge end and the fourth bridge end are exposed by the second bridge insulation layer; and in a case where the bridge sub-circuit board is mounted on the main sub-circuit board, the second side is closer to the main sub-circuit board than the first side.

For example, in the flexible printed circuit provided by at least one embodiment of the present disclosure, the bridge sub-circuit board further comprises a second bridge wiring layer on a second side of the second substrate opposite to the first side, and a second bridge insulation layer stacked on a side of the second bridge wiring layer away from the second substrate, the first bridge wiring layer further comprises the third bridge end, and the third bridge end is exposed by the first bridge insulation layer; and the second bridge wiring layer comprises the third wiring portion and the fourth bridge end, and the fourth bridge end is exposed by the second bridge insulation layer.

For example, in the flexible printed circuit provided by at least one embodiment of the present disclosure, the bridge sub-circuit board further comprises a shield layer on the second side of the second substrate and stacked on a side of the second bridge insulation layer away from the second substrate.

For example, in the flexible printed circuit provided by at least one embodiment of the present disclosure, the third bridge end and the fourth bridge end of the bridging sub-circuit board are respectively connected to the first bridge end and the second bridge end of the main sub-circuit board through an anisotropic conductive adhesive, a solder material, or a connector.

For example, in the flexible printed circuit provided by at least one embodiment of the present disclosure, the main sub-circuit board comprises a plurality of first bridge ends and a plurality of second bridge ends; the flexible printed circuit comprises a plurality of bridge sub-circuit boards, and the plurality of bridge sub-circuit boards are mounted on the main sub-circuit board by electrically connecting a plurality of third bridge ends and a plurality of fourth bridge ends to the plurality of first bridge ends and the plurality of second bridge ends, respectively.

At least one embodiment of the present disclosure provides a flexible printed circuit, and the flexible printed circuit comprises: a main sub-circuit board, comprising a first substrate, and a first bridge end, a second bridge end, a first wiring portion, and a second wiring portion on the first substrate, the first wiring portion and the second wiring portion being spaced apart from each other and being electrically connected to the first bridge end and the second bridge end, respectively; and a bridge sub-circuit board, comprising a second substrate, and a third bridge end, a fourth bridge end, and a third wiring portion for a first functional wiring line on the second substrate, the third bridge end and the fourth bridge end being electrically connected by the third wiring portion. The first substrate and the second substrate are not in direct contact, and the bridge sub-circuit board is configured to be mounted on the main sub-circuit board by electrically connecting the third bridge end and the fourth bridge end to the first bridge end and the second bridge end, respectively. The main sub-circuit board comprises a first main wiring layer on a first side of the first substrate and a first main insulation layer stacked on a side of the first main wiring layer away from the first substrate, the first main wiring layer comprises the first wiring portion, the second wiring portion, the first bridge end, and the second bridge end, and the first bridge end and the second bridge end are exposed by the first main insulation layer; the main sub-circuit board further comprises a second main wiring layer, on a second side of the first substrate opposite to the first side, and a second main insulation layer stacked on a side of the second main wiring layer away from the first substrate, the second main wiring layer comprises the first wiring portion and the second wiring portion; the bridge sub-circuit board comprises a first bridge wiring layer on a first side of the second substrate and a first bridge insulation layer stacked on a side of the first bridge wiring layer away from the second substrate, and the first bridge wiring layer comprises the third wiring portion; the bridge sub-circuit board further comprises a second bridge wiring layer on a second side of the second substrate opposite to the first side, and a second bridge insulation layer stacked on a side of the second bridge wiring layer away from the second substrate, the second bridge wiring layer comprises the third wiring portion, the third bridge end, and the fourth bridge end, the third bridge end and the fourth bridge end are exposed by the second bridge insulation layer. In a case where the bridge sub-circuit board is mounted on the main sub-circuit board, the second side is closer to the main sub-circuit board than the first side.

At least one embodiment of the present disclosure provides an electronic device module, and the electronic device module comprises an electronic device substrate and the flexible printed circuit according to any one of the above embodiments; the electronic device substrate comprises a first functional circuit structure, and the first functional wiring line of the flexible printed circuit is electrically connected to the first functional circuit structure.

For example, in the electronic device module provided by at least one embodiment of the present disclosure, the flexible printed circuit further comprises a second functional wiring line, the first functional circuit structure comprises a first signal transmission portion and a second signal transmission portion, the first functional wiring line is electrically connected to the first signal transmission portion, and the second functional wiring line is electrically connected to the second signal transmission portion.

For example, in the electronic device module provided by at least one embodiment of the present disclosure, the electronic device substrate further comprises a second functional circuit structure, and the flexible printed circuit further comprises a third functional wiring line, and the third functional wiring line is electrically connected to the second functional circuit structure.

For example, in the electronic device module provided by at least one embodiment of the present disclosure, the first functional circuit structure is a touch circuit structure, and the second functional circuit structure is a display circuit structure.

For example, in the electronic device module provided by at least one embodiment of the present disclosure, the first signal transmission portion is a touch driving circuit of the touch circuit structure, and the second signal transmission portion is a touch sensing circuit of the touch circuit structure; or the first signal transmission portion is a touch sensing circuit of the touch circuit structure, and the second signal transmission portion is a touch driving circuit of the touch circuit structure.

At least one embodiment of the present disclosure provides an electronic device, which comprises the electronic device module according to any one of the above embodiments.

At least one embodiment of the present disclosure provides a manufacturing method fora flexible printed circuit, which comprises: providing a main sub-circuit board, the main sub-circuit board comprising a first substrate, and a first bridge end, a second bridge end, a first wiring portion, and a second wiring portion on the first substrate, the first wiring portion and the second wiring portion being spaced apart from each other and are electrically connected to the first bridge end and the second bridge end, respectively; providing a bridge sub-circuit board, the bridge sub-circuit board comprising a second substrate, and a third bridge end, a fourth bridge end, and a third wiring portion for a first functional wiring line on the second substrate, the third bridge end and the fourth bridge end being electrically connected by the third wiring portion; and electrically connecting the third bridge end and the fourth bridge end of the bridge sub-circuit board to the first bridge end and the second bridge end of the main sub-circuit board, respectively, so that the bridge sub-circuit board is mounted on the main sub-circuit board, and the first substrate and the second substrate are not in direct contact.

For example, in the manufacturing method for a flexible printed circuit provided by at least one embodiment of the present disclosure, the third bridge end and the fourth bridge end of the bridge sub-circuit board are respectively connected to the first bridge end and the second bridge end of the main sub-circuit board through a hot pressing method, a welding method, or through a connector.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1A:
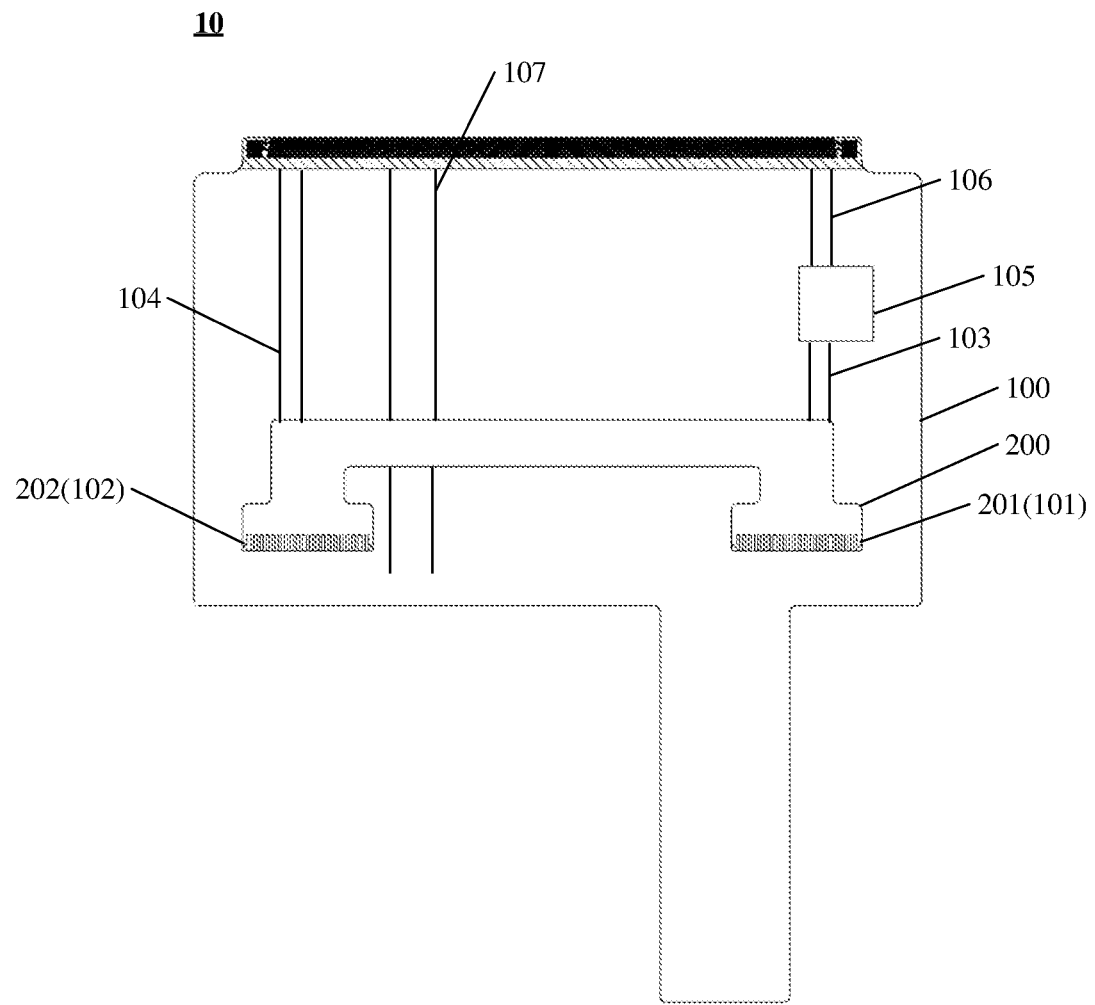
FIG. 1A is a schematic plan diagram of a flexible printed circuit provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A variety of signal wiring lines can usually be integrated on a flexible printed circuit and are used to transmit different types of signals. In a case where there are many types of signal wiring lines on the flexible printed circuit, for example, in a case where a plurality of signal wiring lines for display signals, touch signals, fingerprint identification signals, etc. are required at the same time, the wiring difficulty in the flexible printed circuit will also increase. In this regard, the flexible printed circuit is often formed with a plurality of layers of wiring lines, for example, with four or six layers of wiring lines, etc., so as to facilitate the arrangement of various wiring lines, so that the plurality of wiring lines can be distributed on different layers, thereby reducing the mutual interference between different types of wiring lines. However, in the process of manufacturing a flexible printed circuit with a plurality of wiring layers, it is also necessary to form an insulation layer (and a corresponding adhesive layer) between adjacent wiring layers, if necessary, in order to avoid signal crosstalk between different wiring lines, it is also necessary to form a (electromagnetic signal) shield layer between different wiring lines, which further increases the difficulty of manufacturing the flexible printed circuit.

At least one embodiment of the present disclosure provides a flexible printed circuit, and the flexible printed circuit includes a main sub-circuit board and a bridge sub-circuit board, the main sub-circuit board includes a first substrate, and a first bridge end, a second bridge end, a first wiring portion, and a second wiring portion provided on the first substrate; the first wiring portion and the second wiring portion are spaced apart from each other and are electrically connected to the first bridge end and the second bridge end, respectively; the bridge sub-circuit board includes a second substrate, and a third bridge end, a fourth bridge end, and a third wiring portion provided on the second substrate, the third bridge end and the fourth bridge end are electrically connected by the third wiring portion, the first substrate and the second substrate are not in direct contact, and the bridge sub-circuit board is configured to be mounted on the main sub-circuit board by electrically connecting the third bridge end and the fourth bridge end to the first bridge end and the second bridge end, respectively.

At least one embodiment of the present disclosure provides an electronic device module, which includes an electronic device substrate and the above flexible printed circuit; the electronic device substrate includes a first functional circuit structure, and the first functional wiring line of the flexible printed circuit is electrically connected to the first functional circuit structure.

At least one embodiment of the present disclosure provides an electronic device, which includes the above electronic device module.

The flexible printed circuit and a manufacturing method thereof, an electronic device module, and an electronic device provided by the present disclosure will be described below through several specific embodiments.

Some embodiments of the present disclosure provide a flexible printed circuit, and FIG. 1A is a schematic plan diagram of the flexible printed circuit. As shown in FIG. 1A, the flexible printed circuit 10 includes a main sub-circuit board 100 and a bridge sub-circuit board 200, and the bridge sub-circuit board 200 can be electrically connected to the main sub-circuit board 100.

Figure 2:
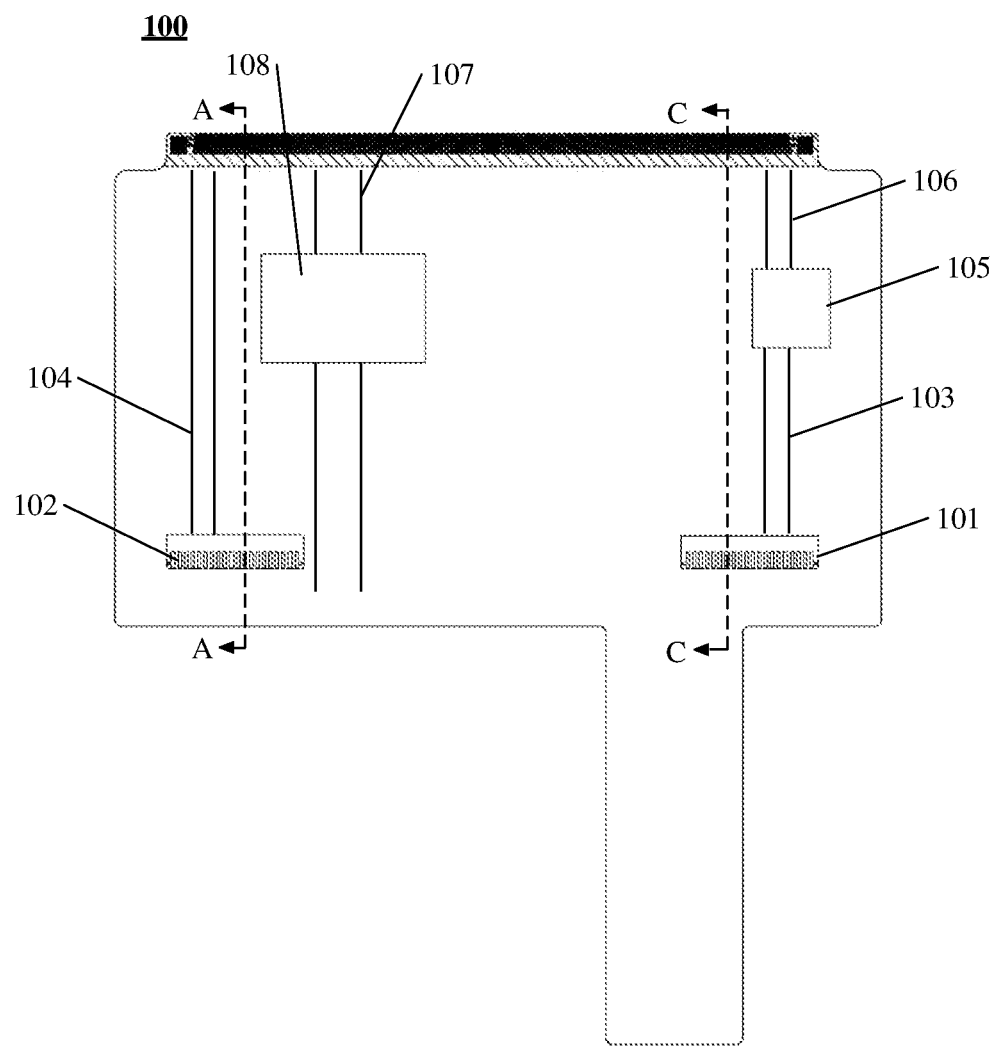
FIG. 2 is a schematic plan diagram of a main sub-circuit board of a flexible printed circuit provided by at least one embodiment of the present disclosure.

FIG. 2 is a schematic plan diagram of the main sub-circuit board 100. As shown in FIG. 2, the main sub-circuit board 100 includes a first substrate, and a first bridge end 101, a second bridge end 102, a first wiring portion 103, and a second wiring portion 104 provided on the first substrate; the first wiring portion 103 and the second wiring portion 104 are spaced apart from each other by a predetermined space (distance), and are electrically connected to the first bridge end 101 and the second bridge end 102, respectively. For example, the first bridge end 101 includes a plurality of first contact pads, and the second bridge end 102 includes a plurality of second contact pads. For example, the first wiring portion 103 includes a plurality of wiring lines, and ends of the plurality of wiring lines included in the first wiring portion 103 are electrically connected to the plurality of first contact pads included in the first bridge end 101 in one-to-one correspondence; the second wiring portion 104 also includes a plurality of wiring lines, and ends of the plurality of wiring lines included in the second wiring portion 104 are electrically connected to the plurality of second contact pads included in the second bridge end 102 in one-to-one correspondence. Although only two wiring lines included in the first wiring portion 103 and two wiring lines included in the second wiring portion 104 are shown in the figure, the embodiments of the present disclosure are not limited thereto.

Figure 3:
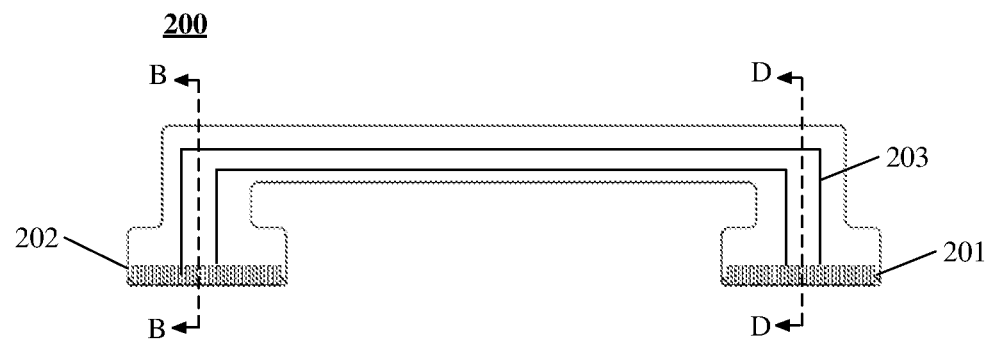
FIG. 3 is a schematic plan diagram of a bridge sub-circuit board of a flexible printed circuit provided by at least one embodiment of the present disclosure.

FIG. 3 is a schematic plan diagram of the bridge sub-circuit board 200. As shown in FIG. 3, the bridge sub-circuit board 200 includes a second substrate, and a third bridge end 201, a fourth bridge end 202, and a third wiring portion 203 provided on the second substrate, the third bridge end 201 and the fourth bridge end 202 are electrically connected by the third wiring portion 203. For example, the third bridge end 201 includes a plurality of third contact pads, the fourth bridge end 202 includes a plurality of fourth contact pads, and the third wiring portion 203 includes a plurality of wiring lines, and these wiring lines are electrically connected in one-to-one correspondence with the plurality of third contact pads included in the third bridge end 201 at one ends, and are electrically connected in one-to-one correspondence with the plurality of fourth contact pads included in the fourth bridge end 202 at the other ends. Although only two wiring lines included in the third wiring portion 203 are shown in the figure, the embodiments of the present disclosure are not limited thereto.

The bridge sub-circuit board 200 is configured to be able to be mounted on the main sub-circuit board 100 by electrically connecting the third bridge end 201 and the fourth bridge end 202 to the first bridge end 101 and the second bridge end 102, respectively. In a case where the bridge sub-circuit board 200 is mounted on the main sub-circuit board 100, the first wiring portion 103, the third wiring portion 203, and the second wiring portion 104 are electrically connected in sequence to obtain the first functional wiring line, and therefore an electrical signal can be transmitted from the first wiring portion 103 through the third wiring portion 203 to the second wiring portion 104, or can be transmitted from the second wiring portion 104 through the third wiring portion 203 to the first wiring portion 103.

For example, FIG. 1A shows a case where the bridge sub-circuit board 200 is mounted on the main sub-circuit board 100 by electrically connecting the third bridge end 201 and the fourth bridge end 202 to the first bridge end 101 and the second bridge end 102, respectively, in some embodiments, the main sub-circuit board 100 and the bridge sub-circuit board 200 may also be in a state to be connected, that is, the separate main sub-circuit board 100 and the separate bridge sub-circuit board 200 are also within the protection scope of the present disclosure.

For example, in some embodiments, as shown in FIG. 2, the flexible printed circuit 10 may further include a first control circuit combination structure 105, and the first control circuit combination structure 105 is disposed on the main sub-circuit board 100. For example, the first control circuit combination structure 105 includes a plurality of contact pads for mounting a first control circuit, a part of the plurality of contact pads is electrically connected to the other ends of the plurality of wiring lines included in the first wiring portion 103 in one-to-one correspondence. The first control circuit combination structure 105 is configured to provide a first electrical signal to the first functional wiring line or receive a first electrical signal from the first functional wiring line.

For example, the first control circuit may be a driving IC chip. There are many methods (that is, package methods) to connect the driving IC chip with the flexible printed circuit, such as a tape carrier package (TCP) method, a chip on film (COF) package method, etc. In the TCP method, the flexible printed circuit includes a plurality of contact pads, and a plurality of pins of the driving IC chip are soldered (such as eutectic soldering) to the plurality of contact pads of the flexible printed circuit in one-to-one correspondence, or are electrically connected to the plurality of contact pads of the flexible printed circuit in one-to-one correspondence through an anisotropic conductive adhesive (ACF), and the soldered portion is protected at least by, for example, epoxy resin; in order to increase the bendability of the flexible printed circuit in the TCP method, a slit may be formed in the package portion. In the COF package method, the flexible printed circuit includes a plurality of contact pads, and the plurality of pins of the driving IC chip are directly crimped on the plurality of contact pads of the flexible printed circuit through the ACF, so that the plurality of pins of the driving IC chip are electrically connected to the plurality of contact pads of the flexible printed circuit in one-to-one correspondence. For example, the size, the arrangement, and the like of the contact pads, which are used to combine the driving IC chip, on the flexible printed circuit can be adjusted according to different types of package methods or the driving IC chip to be packaged, for example, these contact pads can be arranged in a strip shape or a rectangular shape. The embodiments of the present disclosure do not limit the package method for the driving IC chip.

For example, in some embodiments, as shown in FIG. 2, the main sub-circuit board 100 of the flexible printed circuit 10 may further include a second functional wiring line 106, and the second functional wiring line 106 includes a plurality of wiring lines. Another part of the contact pads in the first control circuit combination structure 105 is electrically connected to the plurality of wiring lines included in the second functional wiring line 106 in one-to-one correspondence, in this case, the first control circuit mounted on the first control circuit combination structure 105 is further configured to provide a second electrical signal to the second functional wiring line 106 or receive a second electrical signal from the second functional wiring line 106.

For example, in some embodiments, as shown in FIGS. 1A and 2, the main sub-circuit board 100 of the flexible printed circuit 10 further includes a third functional wiring line 107, and the third functional wiring line 107 is located between the first wiring portion 103 and the second wiring portion 104, thereby passing through the predetermined space between the first wiring portion 103 and the second wiring portion 104, for example, the third functional wiring line 107 crosses the bridge sub-circuit board 200 mounted on the main sub-circuit board 100 in a direction perpendicular to a board surface of the main sub-circuit board 100. In this case, the third wiring portion 203 on the bridge sub-circuit board 200 crosses the third functional wiring line 107 to electrically connect the first wiring portion 103 and the second wiring portion 104 on two sides of the main sub-circuit board 100, so as to avoid forming crossed wiring lines on the main sub-circuit board 100 itself, so that signal crosstalk between different wiring lines can be avoided or reduced, or additional functional layers can be avoided to prevent signal crosstalk, thereby avoiding the complexity of the circuit board structure; in addition, the design can also simplify the wiring layout of the main sub-circuit board 100, so that the manufacturing process of the main sub-circuit board becomes simple.

For example, in some embodiments, as shown in FIG. 2, the first wiring portion 103, the second wiring portion 104, and the third functional wiring line 107 are routed in the same direction, such as parallel routing or substantially parallel routing (as long as the wiring lines do not cross each other), such as the parallel routing in a vertical direction shown in the figure. Thereby, the above-mentioned various wiring lines on the main sub-circuit board 100 have no crossing parts, and the wiring layout is simpler. For example, in some embodiments, these wiring lines may be arranged in the same wiring layer, thereby reducing the number of wiring layers and simplifying a layered structure of the flexible printed circuit.

Figure 1B:
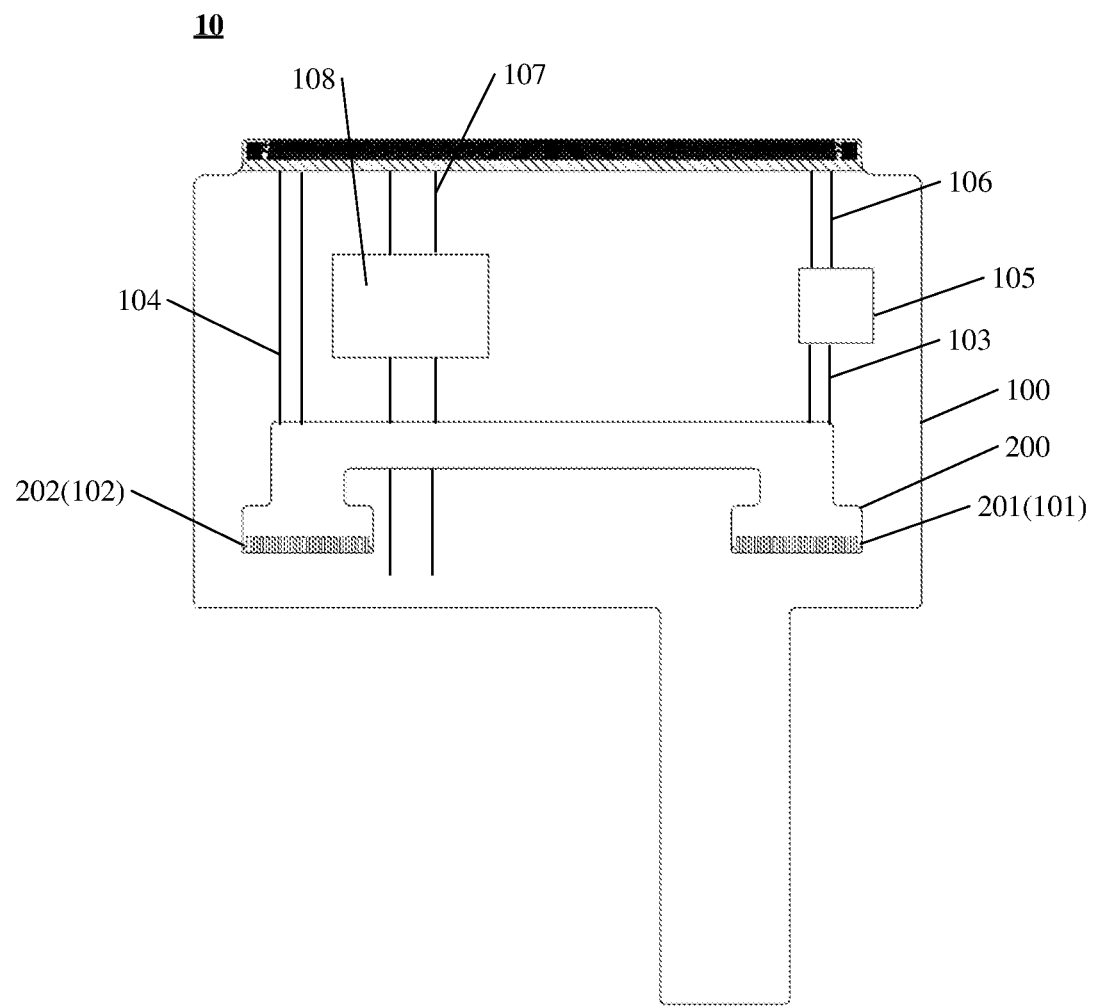
FIG. 1B is a schematic plan diagram of a flexible printed circuit provided by at least one embodiment of the present disclosure.

For example, in some embodiments, as shown in FIGS. 1B and 2, the flexible printed circuit 10 may further include a second control circuit combination structure 108, and the second control circuit combination structure 108 is disposed on the main sub-circuit board 100. For example, the second control circuit combination structure 108 includes a plurality of contact pads for mounting the second control circuit, and at least a part of the plurality of contact pads is electrically connected to one end of the third functional wiring line 107 in one-to-one correspondence. The second control circuit combination structure 108 is configured to provide a third electrical signal to the third functional wiring line 107 or receive a third electrical signal from the third functional wiring line 107. For example, the third functional wiring line 107 is divided into two parts, a first part of the third functional wiring line 107 is electrically connected to a first end (shown as a lower end in the figure) of the second control circuit combination structure 108, and a second part of the third functional wiring line 107 is electrically connected between a second end (shown as an upper end in the figure) of the second control circuit combination structure 108 and a contact pad (as described below) formed on one side edge of the main sub-circuit board 100.

For example, the second control circuit may be a driving IC chip. The first control circuit and the second control circuit are used to implement different driving functions. As described above, the method by which the driving IC chip is connected to the flexible printed circuit is, for example, a tape carrier package (TCP) method, a chip on film (COF) package method, and the like. For example, the second control circuit combination structure 108 includes a plurality of contact pads for connecting with the driving IC chip. Similarly, the size, the arrangement, and the like of the contact pads can be adjusted according to different types of package methods or the driving IC chip to be packaged. The embodiments of the present disclosure are not limited in this aspect.

Figure 4A:
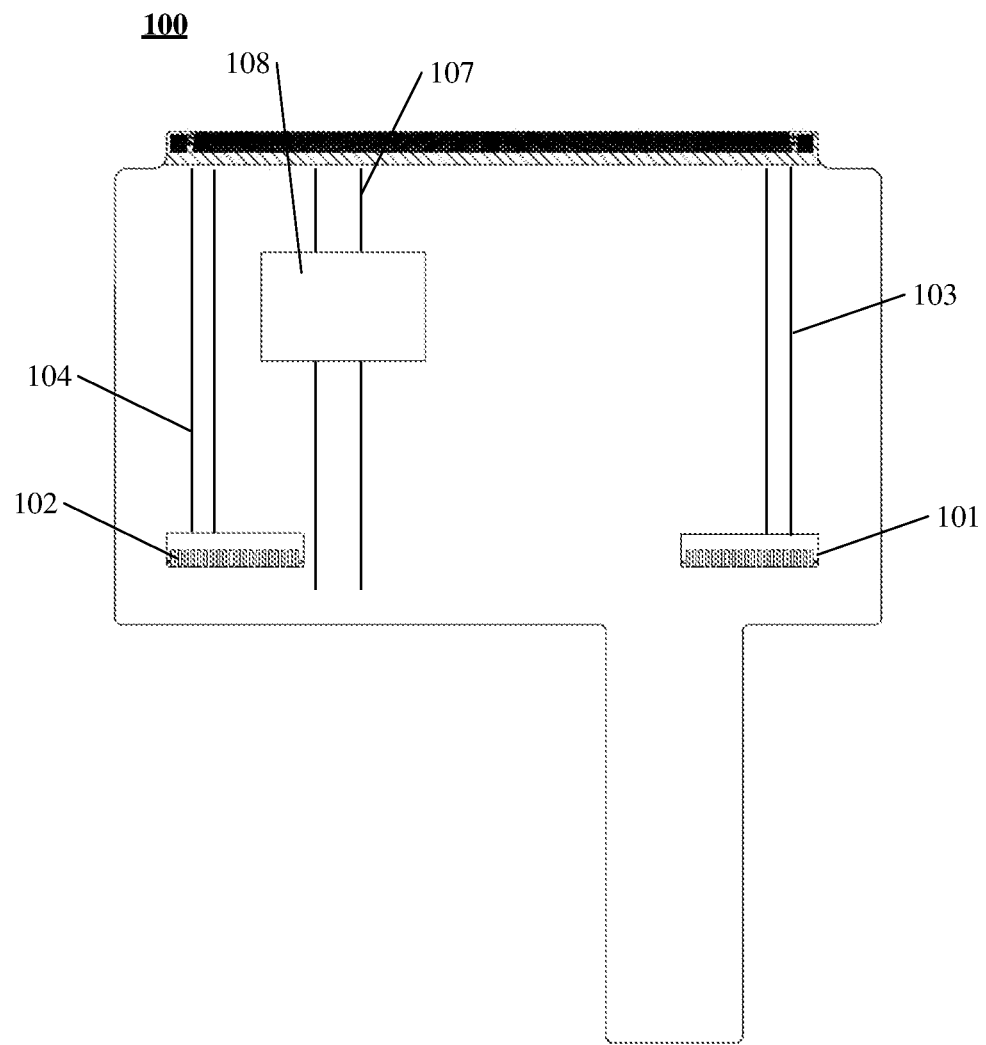
FIG. 4A is a schematic plan diagram of a main sub-circuit board of a flexible printed circuit provided by at least one embodiment of the present disclosure.
Figure 4B:
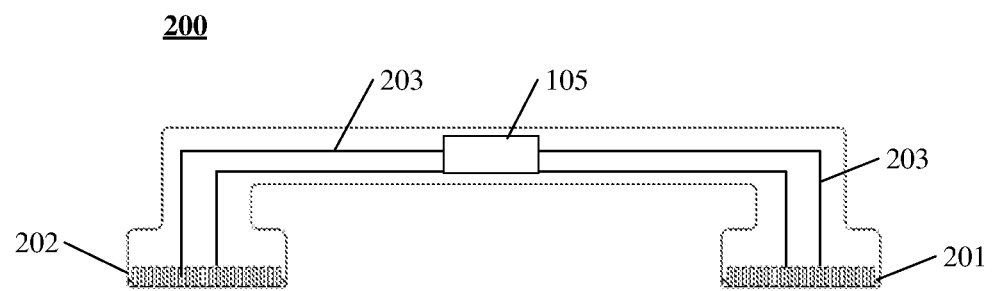
FIG. 4B is a schematic plan diagram of a bridge sub-circuit board of a flexible circuit board provided by at least one embodiment of the present disclosure.

For example, as shown in FIGS. 4A and 4B, in some embodiments, the first control circuit combination structure 105 may also be formed on the bridge sub-circuit board 200, in this case, on the main sub-circuit board 100, the first wiring portion 103 and the second wiring portion 104 are electrically connected to the first bridge end 101 and the second bridge end 102, respectively, on the bridge sub-circuit board 200, the third wiring portion 203 is divided into two parts, a first part of the third wiring portion 203 is electrically connected between the first control circuit combination structure 105 and the third bridge end 201, and a second part of the third wiring portion 203 is electrically connected between the first control circuit combination structure 105 and the fourth bridge end 202. Thus, the first wiring portion 103 and the second wiring portion 104 on the main sub-circuit board 100 are electrically connected to the first control circuit combination structure 105 on the bridge sub-circuit board 200, respectively.

Figure 1C:
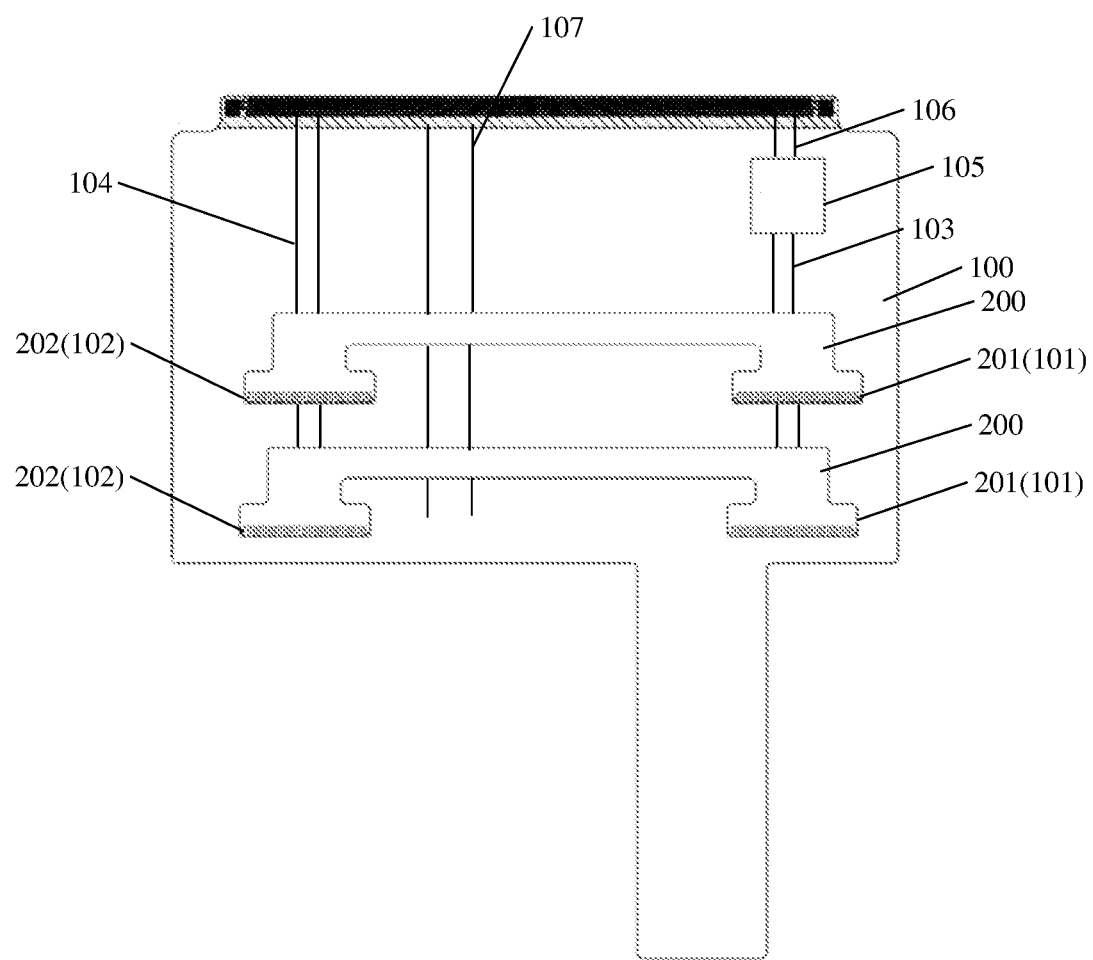
FIG. 1C is a schematic plan diagram of a flexible printed circuit provided by at least one embodiment of the present disclosure.

For example, in some embodiments, as shown in FIG. 1C, there may be a plurality of bridge sub-circuit boards 200 (shown as two in the figure). In this case, the plurality of bridge sub-circuit boards 200 may be simultaneously mounted on the main sub-circuit board 100. For example, the main sub-circuit board 100 includes a plurality of first bridge ends 101 and a plurality of second bridge ends 102, and the plurality of bridge sub-circuit boards 200 are mounted on the main sub-circuit board 100 by electrically connecting a plurality of third bridge ends 201 and a plurality of fourth bridge ends 202 on the plurality of bridge sub-circuit boards 200 to the plurality of first bridge ends 101 and the plurality of second bridge ends 102, respectively.

It should be noted that, in the embodiment shown in FIG. 1C, there are two bridge sub-circuit boards 200, but the embodiments of the present disclosure are not limited to this, the number of bridge sub-circuit boards 200 can be selected according to actual needs. The embodiments of the present disclosure do not limit the number of bridge sub-circuit boards 200.

Figure 1D:
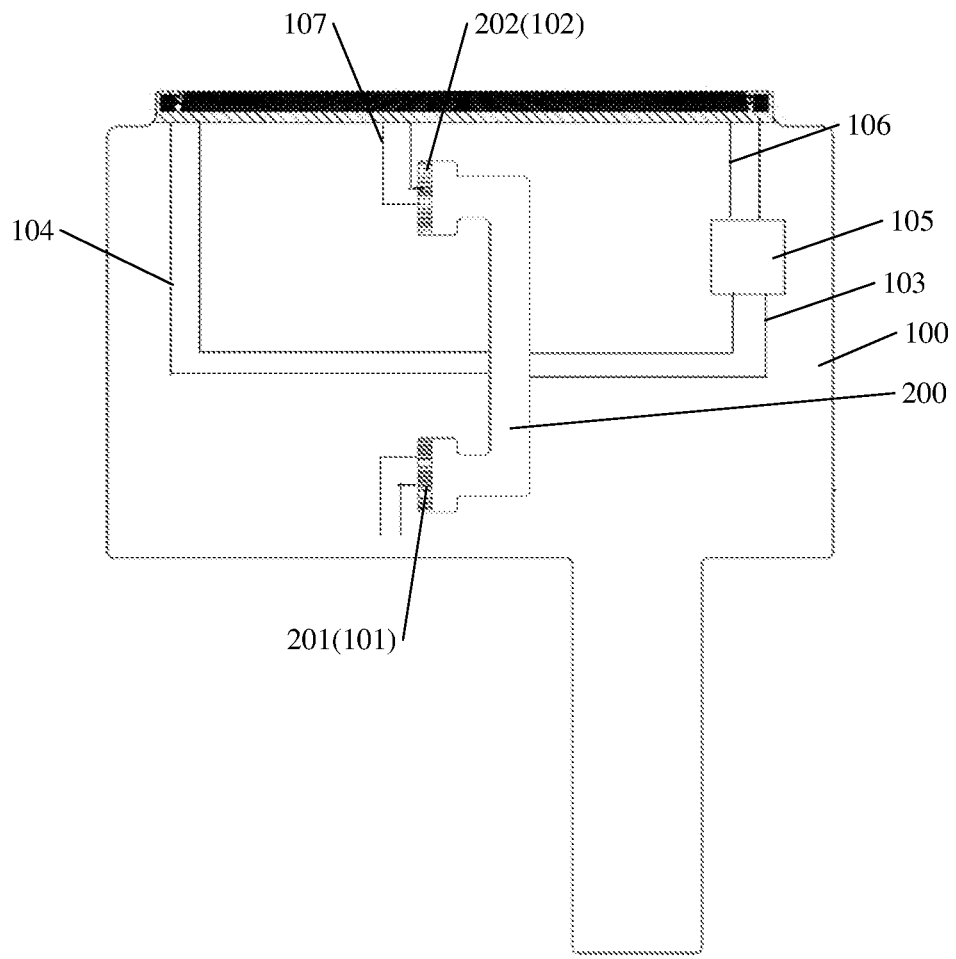
FIG. 1D is a schematic plan diagram of a flexible printed circuit provided by at least one embodiment of the present disclosure.

In addition, the embodiments of the present disclosure do not specifically limit the method for setting the bridge sub-circuit boards 200. For example, in the above embodiments, the bridge sub-circuit board 200 is arranged horizontally, so as to bridge-connect the wiring lines on the left side of the main sub-circuit board 100 and the wiring lines on the right side of the main sub-circuit board 100, and the wiring lines located in a middle part of the main sub-circuit board 100 passes under the bridge sub-circuit board 200. In other embodiments, as shown in FIG. 1D, the arrangement direction of the bridge sub-circuit board 200 may also be a vertical direction, thereby bridge-connecting the wiring lines located on the upper side of the main sub-circuit board 100 and the wiring lines located on the lower side of the main sub-circuit board 100, and the wiring lines on the left side and the right side of the main sub-circuit board 100 pass under the bridge sub-circuit board 200.

Figure 5A:
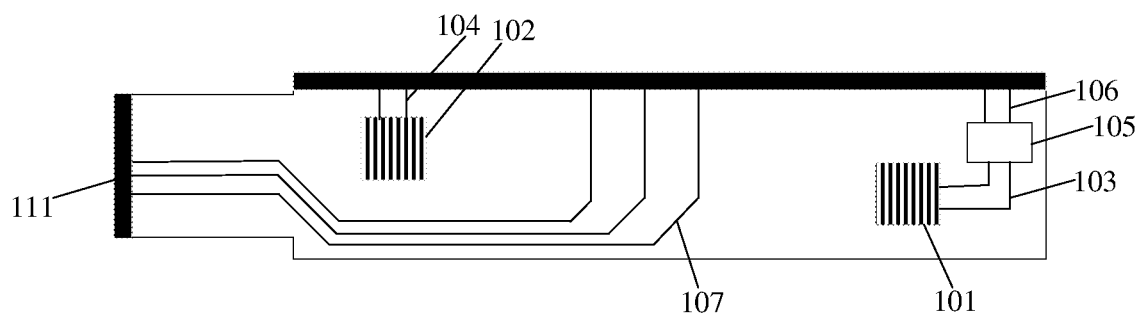
FIG. 5A is a schematic plan diagram of a main sub-circuit board of a flexible printed circuit provided by at least one embodiment of the present disclosure.

For example, FIG. 5A shows a schematic plan diagram of another main sub-circuit board provided by an embodiment of the present disclosure. The main sub-circuit board adopts a shape and a circuit arrangement that are different from those in the above embodiments.

For example, as shown in FIG. 5, the main sub-circuit board is in a long strip shape, and the structures, such as the first bridge end 101, the second bridge end 102, the first wiring portion 103, the second wiring portion 104, the second functional wiring line 106, and the like, of the main sub-circuit board have the similar arrangement to the arrangement of those of the main sub-circuit board of the above embodiments. The main sub-circuit board in this embodiment is different from the main sub-circuit board of the above embodiments in that: in the main sub-circuit board shown in FIG. 5, the third wiring portion 107 extends along the middle part of the main sub-circuit board, turns to the left side of the main sub-circuit board on one side (the lower side shown in the figure) of the main sub-circuit board, and is electrically connected to a wiring connection end 111 on the left side of the main sub-circuit board. The wiring connection end 111 has a plurality of contact pads, and the plurality of wiring lines in the third wiring portion 107 are electrically connected to the plurality of contact pads on the connection wiring end 111 in one-to-one correspondence. For example, the wiring connection end 111 may be used for electrical connection with other electronic devices, control chips, or the like, and the embodiments of the present disclosure do not limit this.

For example, in some embodiments, the main sub-circuit board may be a single-layer wiring structure or a multi-layer wiring structure (such as a double-layer wiring structure or a three-layer wiring structure, etc.), and the embodiments of the present disclosure do not limit this.

Figure 6A:
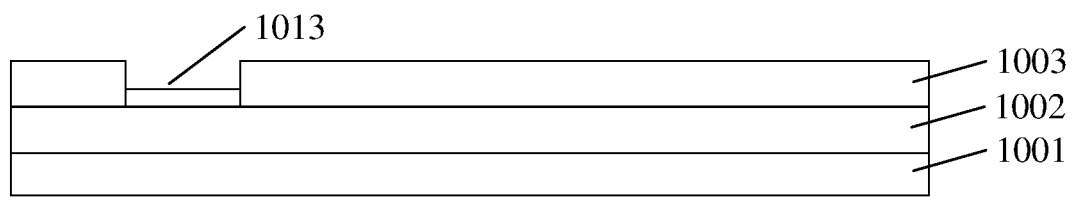
FIG. 6A is a schematic cross-sectional diagram of a main sub-circuit board of a flexible printed circuit provided by at least one embodiment of the present disclosure.

For example, FIG. 6A shows a schematic cross-sectional diagram of a main sub-circuit board provided by some embodiments of the present disclosure. The cross-sectional diagram is obtained by taking along a line A-A in FIG. 2, for example. In these embodiments, the main sub-circuit board 100 has a single-layer wiring structure. As shown in FIG. 6A, the main sub-circuit board 100 includes a first substrate 1001, and a first main wiring layer 1002 and a first main insulation layer 1003 stacked on one side of the first substrate 1001. The first main wiring layer 1002 includes structures such as the first wiring portion 103, the second wiring portion 104, the first bridge end 101, the second bridge end 102, and the like. The first bridge end 101 and the second bridge end 102 are exposed by the first main insulation layer 1003. For example, the first main insulation layer 1003 serves as a protective layer, and provides structural and electrical protection for the first main wiring layer 1002. For example, the first main insulation layer 1003 may be bonded to the first main wiring layer 1002 and the first substrate 1001 through an adhesive layer (not shown). For example, an opening 1013 is formed in the first main insulation layer 1003, and in the opening 1013, for example, a portion of the exposed first wiring layer 1002 corresponding to the first bridge end 101 or the second bridge end 102 may be surface-treated (such as plated a solder layer) to form a plurality of patterned contact pads, thereby correspondingly forming the first bridge end 101 or the second bridge end 102.

For example, in a case where the main sub-circuit board further includes the second functional wiring line 106 and the third functional wiring line 107, the second functional wiring line 106 and the third functional wiring line 107 are also arranged in the first main wiring layer 1002. In this case, the main sub-circuit board is a single-layer wiring structure with a single-layer wiring layer.

Figure 6B:
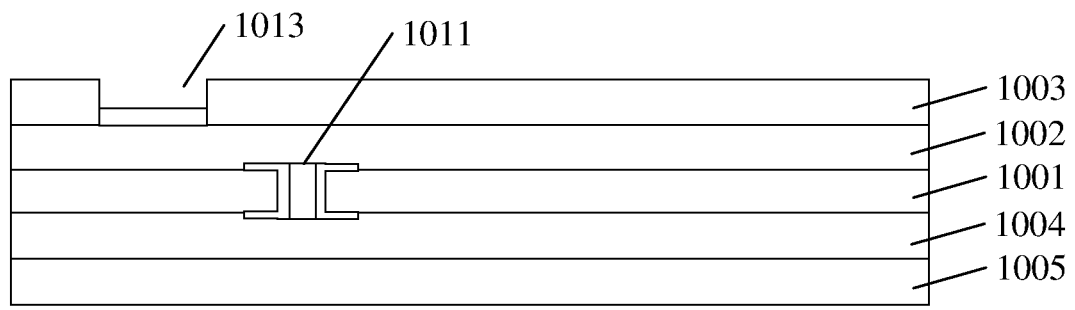
FIG. 6B is a schematic cross-sectional diagram of a main sub-circuit board of a flexible printed circuit provided by at least one embodiment of the present disclosure.

For example, FIG. 6B shows a schematic cross-sectional diagram of another main sub-circuit board provided by some embodiments of the present disclosure. The cross-sectional diagram is obtained by cutting along the line A-A in FIG. 2, for example. In these embodiments, the main sub-circuit board 100 has a multi-layer wiring structure, and the embodiments are described below with reference to FIG. 6B by taking the main sub-circuit board 100 having a double-layer wiring structure as an example, but the embodiments of the present disclosure are not limited thereto.

As shown in FIG. 6B, in this example, the main sub-circuit board 100 includes a first substrate 1001, and a first main wiring layer 1002 and a first main insulation layer 1003 stacked on a first side (shown as an upper side in the figure) of the first substrate 1001, and further comprises a second main wiring layer 1004 and a second main insulation layer 1005 stacked on a second side (shown as a lower side in the figure) of the first substrate 1001. The first main insulation layer 1003 serves as a protective layer, and provides structural and electrical protection for the first main wiring layer 1002, for example, the first main insulation layer 1003 may be bonded to the first main wiring layer 1002 and the first substrate 1001 through an adhesive layer (not shown in the figure); the second main insulation layer 1005 serves as a protective layer to provide structural and electrical protection for the second main wiring layer 1004. For example, the second main insulation layer 1005 may be bonded to the second main wiring layer 1004 and the first substrate 1001 through an adhesive layer (not shown in the figure).

For example, in some examples, the first main wiring layer 1002 includes the first wiring portion 103 and the second wiring portion 104, in this case, the first wiring portion 103 and the second wiring portion 104 may be arranged alternately in the first main wiring layer 1002 and the second main wiring layer 1004. For example, the two adjacent wiring lines of the first wiring portion 103 along the board surface of the main sub-circuit board 100 may be located in the first main wiring layer 1002 and the second main wiring layer 1004, respectively, thereby facilitating the wiring layout. For example, the second wiring portion 104 may be similarly provided.

For example, in a case where the main sub-circuit board further includes the second functional wiring line 106 and the third functional wiring line 107, the second functional wiring line 106 and the third functional wiring line 107 may also be arranged alternately in the first main wiring layer 1002 and the second main wiring layer 1004. Alternatively, the first main wiring layer 1002 may include the first wiring portion 103 and the second wiring portion 104, and the second main wiring layer 1004 may include the second functional wiring line 106 and the third functional wiring line 107, that is, different functional wiring lines may be arranged on different wiring layers. The embodiments of the present disclosure do not specifically limit the wiring layout on the main sub-circuit board 100.

Figure 5B:
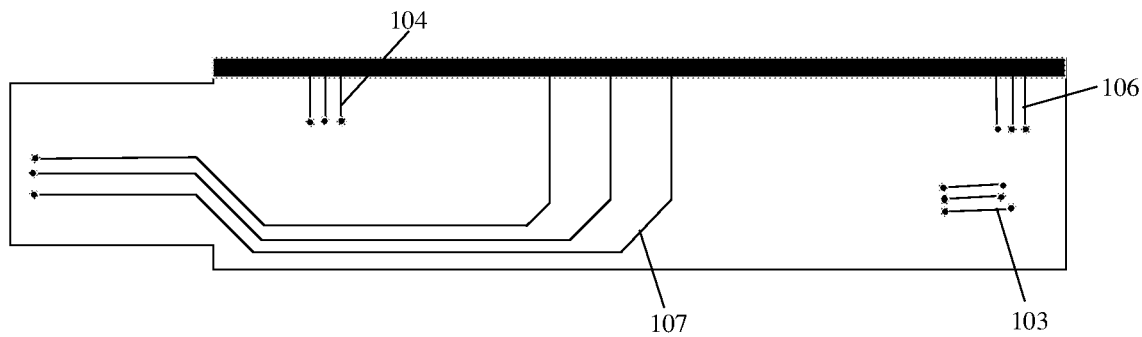
FIG. 5B is a schematic plan diagram of a main sub-circuit board of a flexible printed circuit provided by at least one embodiment of the present disclosure.

For example, in the embodiment shown in FIG. 5A, in a case where the first wiring portion 103, the second wiring portion 104, the second functional wiring line 106, and the third functional wiring line 107 on the main sub-circuit board 100 are alternately arranged in the first main wiring layer 1002 and the second main wiring layer 1004, a schematic plan diagram of the first main wiring layer 1002 is shown in FIG. 5A, and a schematic plan diagram of the second main wiring layer 1004 is shown in FIG. 5B. In this case, the wiring lines in the second main wiring layer 1004 have a similar arrangement to the wiring lines in the first main wiring layer 1002, and the wiring lines in the second main wiring layer 1004 can be electrically connected to the first main wiring layer 1002 through via holes (for example, black dots shown in FIG. 5B) and exposed by a corresponding insulation layer to form a bridge end.

For example, in some embodiments, as shown in FIG. 6B, the first bridge end 101 and the second bridge end 102 may be exposed by the first main insulation layer 1003. For example, similarly, an opening 1013 is formed in the first main insulation layer 1003, and in the opening 1013, for example, surface treatment can be performed on a portion of the exposed first main wiring layer 1002 corresponding to the first bridge end 101 or the second bridge end 102, so as to form a plurality of patterned contact pads and correspondingly form the first bridge end 101 or the second bridge end 102; similarly, for the wiring lines in the second main wiring layer 1004, the bridge end may be formed by the wiring lines passing through the via hole 1011 in the first substrate 1001, the first main wiring layer 1002, and the opening 1013 of the first main insulation layer 1003. For example, the via hole 1011 in the first substrate 1001 and the opening 1013 of the first main insulation layer 1003 are arranged in a misaligned manner. Therefore, in the manufacturing process, the position of the opening 1013 is relatively flat, thereby facilitating the formation of the contact pads.

For example, in some embodiments, the first bridge end 101 and the second bridge end 102 may be exposed on different sides of the main sub-circuit board, respectively, so that the first bridge end 101 and the second bridge end 102 are disposed on different sides of the main sub-circuit board.

Figure 7A:
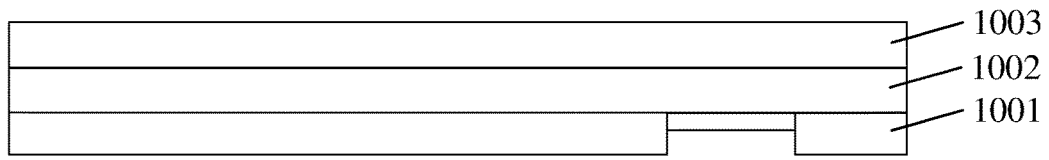
FIG. 7A is another schematic cross-sectional diagram of a main sub-circuit board of a flexible printed circuit provided by at least one embodiment of the present disclosure.

For example, FIG. 7A shows a schematic cross-sectional diagram of a main sub-circuit board provided by some embodiments of the present disclosure. The cross-sectional diagram is obtained by cutting along a line C-C in FIG. 2, for example. In this embodiment, the main sub-circuit board has a single-layer wiring structure. The first bridge end 101 of the main sub-circuit board is exposed by the first main insulation layer 1003, as shown in FIG. 6A; and the second bridge end 102 is exposed by the first substrate 1001, so that the first bridge end 101 and the second bridge end 102 are disposed on different sides of the main sub-circuit board.

Figure 7B:
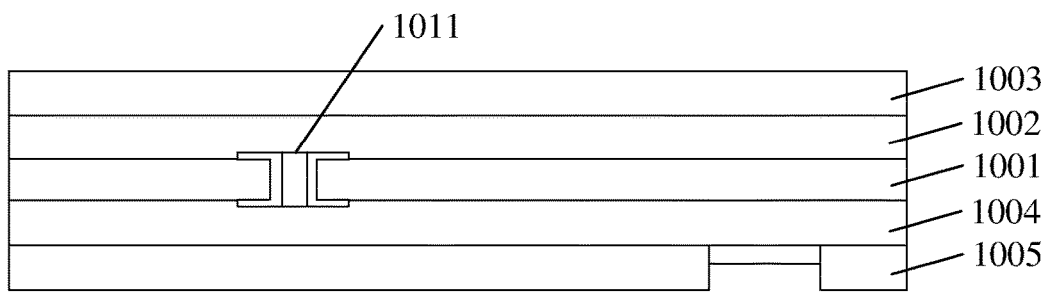
FIG. 7B is another schematic cross-sectional diagram of a main sub-circuit board of a flexible printed circuit provided by at least one embodiment of the present disclosure.

For example, FIG. 7B shows a schematic cross-sectional diagram of another main sub-circuit board provided by some embodiments of the present disclosure. The cross-sectional diagram is obtained by cutting along the line C-C in FIG. 2, for example. In this embodiment, the main sub-circuit board has a double-layer wiring structure. The first bridge end 101 of the main sub-circuit board is exposed by the first main insulation layer 1003, as shown in FIG. 6B; and the second bridge end 102 is exposed by the second main insulation layer 1005, so that the first bridge end 101 and the second bridge end 102 are disposed on different sides of the main sub-circuit board.

For example, in some embodiments, the main sub-circuit board may also have a multi-layer wiring structure such as a three-layer wiring structure, a four-layer wiring structure, or the like. In this case, the various wiring portions on the main sub-circuit board, for example, the first wiring portion, the second wiring portion, the second functional wiring line, and the third functional wiring line may be arranged in a plurality of wiring layers. For example, the first wiring portion, the second wiring portion, the second functional wiring line, and the third functional wiring line are alternately arranged in the plurality of wiring layers, or are respectively arranged in different wiring layers. The embodiments of the present disclosure do not specifically limit the number of wiring layers of the main sub-circuit board and the arrangement of the wiring lines.

Figure 8A:
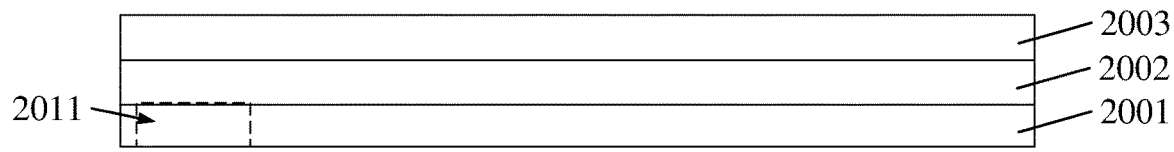
FIG. 8A is a schematic cross-sectional diagram of a bridge sub-circuit board of a flexible printed circuit provided by at least one embodiment of the present disclosure.

Similarly, the bridge sub-circuit board may also have a single-layer wiring structure or a multi-layer wiring structure. For example, FIG. 8A shows a schematic cross-sectional diagram of a bridge sub-circuit board provided by some embodiments of the present disclosure. The cross-sectional diagram is obtained by cutting along a line B-B in FIG. 3A. In these embodiments, the bridge sub-circuit board 200 has a single-layer wiring structure.

For example, as shown in FIG. 8A, the bridge sub-circuit board 200 includes a second substrate 2001 and a first bridge wiring layer 2002 and a first bridge insulation layer 2003 on a first side (shown as an upper side in the figure) of the second substrate 2001, the first bridge wiring layer 2002 includes a third wiring portion 203. Similarly, the first bridge insulation layer 2003 serves as a protective layer, and provides structural and electrical protection for the first bridge wiring layer 2002. For example, the first bridge insulation layer 2003 may be bonded to the first bridge wiring layer 2002 and the second substrate 2001 through an adhesive layer (not shown in the figure).

For example, the second substrate 2001 has an opening 2011, in the opening 2011, for example, a portion of the exposed first bridge wiring layer 2002 corresponding to the third bridge end 201 or the fourth bridge end 202 may be surface-treated to form a plurality of patterned contact pads, thereby correspondingly forming the third bridge end 201 or the fourth bridge end 202.

Figure 8B:
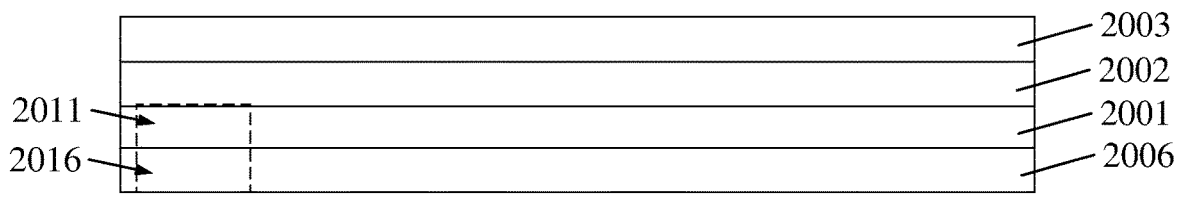
FIG. 8B is a schematic cross-sectional diagram of a bridge sub-circuit board of a flexible printed circuit provided by at least one embodiment of the present disclosure.

For example, in some embodiments, as shown in FIG. 8B, the bridge sub-circuit board 200 may further include a shield layer 2006, the shield layer 2006 is disposed on a side of the second substrate 2001 away from the first bridge wiring layer 2002. For example, the shield layer 2006 can be grounded, thereby achieving the effect of electromagnetic shielding and preventing signal crosstalk generated between the wiring lines in the main sub-circuit board and the wiring lines in the bridge sub-circuit board. For example, the shield layer 2006 has a hollow structure 2016, the hollow structure 2016 corresponds to the opening 2011 in the second substrate 2001 to expose the third bridge end 201 or the fourth bridge end 202.

Figure 8C:
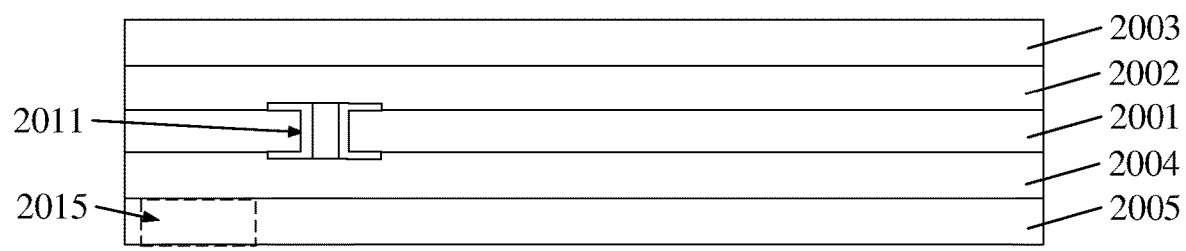
FIG. 8C is a schematic cross-sectional diagram of a bridge sub-circuit board of a flexible printed circuit provided by at least one embodiment of the present disclosure.

For example, FIG. 8C shows a schematic cross-sectional diagram of another bridge sub-circuit board provided by some embodiments of the present disclosure. The cross-sectional diagram is obtained by taking along the line B-B in FIG. 3A, for example. In these embodiments, the bridge sub-circuit board 200 has a multi-layer structure. The following embodiments describe the bridge sub-circuit board 200 having a double-layer structure as an example with reference to FIG. 8C, but the embodiments of the present disclosure are not limited thereto.

As shown in FIG. 8C, the bridge sub-circuit board 200 includes a second substrate 2001 and a first bridge wiring layer 2002 and a first bridge insulation layer 2003 on a first side (shown as the upper side in the figure) of the second substrate 2001, and the first bridge wiring layer 2002 includes the third wiring portion 203. Similarly, the first bridge insulation layer 2003 serves as a protective layer, and provides structural and electrical protection for the first bridge wiring layer 2002. For example, the first bridge insulation layer 2003 may be bonded to the first bridge wiring layer 2002 and the second substrate 2001 through an adhesive layer (not shown in the figure).

For example, as shown in FIG. 8C, the bridge sub-circuit board 200 may further include a second bridge wiring layer 2004 on a second side (shown as the lower side in the figure) of the second substrate 2001 opposite to the first side and a second bridge insulation layer 2005 stacked with the second bridge wiring layer 2004. For example, the second bridge wiring layer 2004 may also include the third wiring portion 203. In this case, the third wiring portion 203 may be alternately arranged in the first bridge wiring layer 2002 and the second bridge wiring layer 2004. For example, the two wiring lines of the third wiring portion 203 adjacent to each other along the board surface of the bridge sub-circuit board 200 may be located in the first bridge wiring layer 2002 and the second bridge wiring layer 2004, respectively, thereby facilitating the wiring layout. For example, the dotted line in FIG. 8D indicates that the wiring portions on two sides of the second bridge wiring layer 2004 are not electrically connected.

For example, the third wiring portion 203 located on the first side of the bridge sub-circuit board 200 is exposed and led out through the via hole 2011 in the second substrate 2001 and the opening 2015 in the second bridge insulation layer 2005, and for example, the third wiring portion 203 is surface-treated to form a plurality of patterned contact pads, thereby constituting the third bridge end 201 or the fourth bridge end 202. For example, the opening 2015 in the second bridge insulation layer 2005 is formed at the position indicated by the dotted frame shown in FIG. 8C or at other suitable positions, which is not limited in the embodiments of the present disclosure.

Figure 8D:
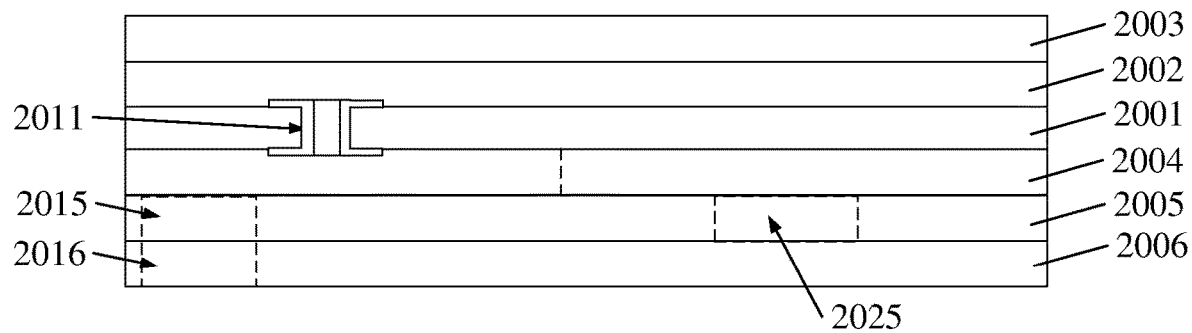
FIG. 8D is a schematic cross-sectional diagram of a bridge sub-circuit board of a flexible printed circuit provided by at least one embodiment of the present disclosure.

For example, as shown in FIG. 8D, in some embodiments, the bridge sub-circuit board 200 may further include a shield layer 2006 on a second side of the second substrate 2001. The shield layer 2006 is provided on the side of the second bridge insulation layer 2005 away from the second substrate 2001, for example. For example, the shield layer 2006 is grounded, and can achieve the effect of electromagnetic shielding. For example, the shield layer 2006 has a hollow structure 2016 at a position corresponding to the opening 2015 of the second bridge insulation layer 2005, thereby exposing the third bridge end 201 or the fourth bridge end 202.

For example, in a case where the bridge sub-circuit board 200 is mounted on the main sub-circuit board 100, the second side is closer to the main sub-circuit board 100 than the first side. Thus, the shield layer 2006 is located between the wiring layers in the main sub-circuit board 100 and the wiring layers in the bridge sub-circuit board 200, and the shield layer 2006 can prevent signal crosstalk generated between the wiring layers in the main sub-circuit board 100 and the wiring layers in the bridge sub-circuit board 200.

For example, in some embodiments, the second bridge wiring layer 2004 may be a (electrically) grounded layer, and may include a plurality of ground wiring lines. In this case, the third wiring portion 203 may be all disposed in the first bridge wiring layer 2002. Thus, there is also a (electrically) grounded layer between the wiring layers in the main sub-circuit board 100 and the wiring layers in the bridge sub-circuit board 200, the (electrically) grounded layer can further prevent signal crosstalk generated between the wiring layers in the main sub-circuit board 100 and the wiring layers in the bridge sub-circuit board 200. Alternatively, in some embodiments, a part of the third wiring portion 203 may be disposed in the first bridge wiring layer 2002, and the other part of the third wiring portion 203 is disposed in the second bridge wiring layer 2004. In this case, the ground wiring lines in the second bridge wiring layer 2004 and part wiring lines of the third wiring portion 203 may be alternately arranged. Thus, the second bridge wiring layer 2004 can also play a role of preventing signal crosstalk.

In a case where the bridge sub-circuit board has a grounded layer and a shield layer 2006, the grounded layer 2004 and the shield layer 2006 can achieve a double shielding effect, thereby preventing the signal crosstalk generated between the respective wiring lines on the main sub-circuit board 100 and the respective wiring lines on the bridge sub-circuit board 200.

For example, in some embodiments, the bridge sub-circuit board 200 may further include an insulation layer (not shown in the figure) located on the outer side of the shield layer 2006 (i.e., a side away from the second substrate 2001) to provide protection to the shield layer 2006, and the insulation layer can be bonded to the shield layer 2006 by an adhesive layer, for example. The insulation layer may further include an opening corresponding to the opening 2015 and the hollow structure 2016 to expose the bridge end. For example, the via hole 2011 in the second substrate 2001 and the opening 2015 in the second bridge insulation layer 2005 are misaligned, so that in the manufacturing process, the position where the opening 1015 is located is relatively flat, thereby facilitating the formation of the contact pads.

For example, in some embodiments, the third bridge end 201 and the fourth bridge end 202 of the bridge sub-circuit board 200 may be exposed on different sides of the bridge sub-circuit board 200, respectively, so that the third bridge end 201 and the fourth bridge end 202 are disposed on different sides of the bridge sub-circuit board 200.

Figure 9A:
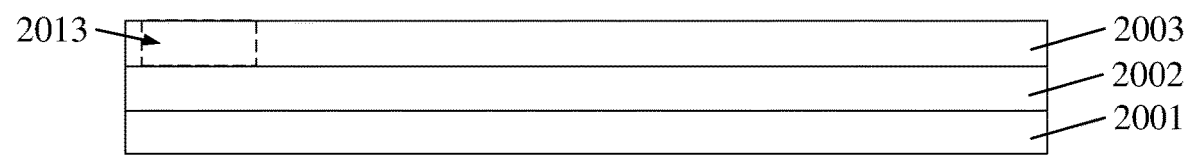
FIG. 9A is another schematic cross-sectional diagram of a bridge sub-circuit board of a flexible printed circuit provided by at least one embodiment of the present disclosure.

For example, FIG. 9A shows a schematic cross-sectional diagram of another bridge sub-circuit board provided by some embodiments of the present disclosure, for example, the cross-sectional diagram is obtained by taking along a line D-D in FIG. 3A. In this embodiment, the bridge sub-circuit board has a single-layer wiring structure. For example, the third bridge end 201 of the bridge sub-circuit board is exposed by the second substrate 2001, as shown in FIG. 8A; and the fourth bridge end 202 is exposed by the opening 2013 in the first bridge insulation layer 2003, as shown in FIG. 9A, so that the third bridge end 201 and the fourth bridge end 202 are disposed on different sides of the bridge sub-circuit board.

Figure 9B:
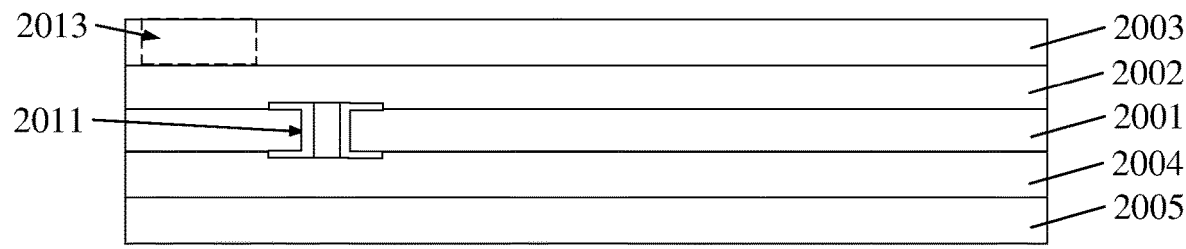
FIG. 9B is another schematic cross-sectional diagram of a bridge sub-circuit board of a flexible printed circuit provided by at least one embodiment of the present disclosure.

For example, FIG. 9B shows a schematic cross-sectional diagram of another bridge sub-circuit board provided by some embodiments of the present disclosure, for example, the cross-sectional diagram is obtained by taking along the line D-D in FIG. 3A. In this embodiment, the bridge sub-circuit board has a double-layer wiring structure. For example, the third bridge end 201 of the bridge sub-circuit board is exposed by the second bridge insulation layer 2005, as shown in FIG. 8C; and the fourth bridge end 202 is exposed by the opening 2013 in the first bridge insulation layer 2003, as shown in FIG. 9B, so that the third bridge end 201 and the fourth bridge end 202 are disposed on different sides of the bridge sub-circuit board.

For example, in some embodiments, the bridge sub-circuit board may also have a multi-layer wiring structure, such as a three-layer wiring structure, a four-layer wiring structure, or the like. In this case, the third wiring portion on the bridge sub-circuit board can be arranged in a plurality of wiring layers. For example, the third wiring portion can be alternately arranged in the plurality of wiring layers. The embodiments of the present disclosure do not specifically limit the number of wiring layers of the bridge sub-circuit board and the arrangement of the wiring lines.

For example, in some embodiments, in a case where the first bridge end 101 and the second bridge end 102 of the main sub-circuit board are disposed on different sides of the main sub-circuit board, and the third bridge end 201 and the fourth bridge end 202 of the bridge sub-circuit board are also disposed on different sides of the bridge sub-circuit board, the third bridge end 201 and the fourth bridge end 202 of the bridge sub-circuit board may be respectively electrically connected to the first bridge end 101 and the second bridge end 102 on different sides of the main sub-circuit board, or, in a case where the first bridge end 101 and the second bridge end 102 of the main sub-circuit board are disposed on different sides of the main sub-circuit board, and the third bridge end 201 and the fourth bridge end 202 of the bridge sub-circuit board are disposed on the same side of the bridge sub-circuit board, the third bridge end 201 and the fourth bridge end 202 of the bridge sub-circuit board can be respectively electrically connected to the first bridge end 101 and the second bridge end 102 on different sides of the main sub-circuit board by bending, so that the bridge sub-circuit board can be bridge-connected to the main sub-circuit board in a form similar to a "hairpin".

For example, the first substrate 1001 and the second substrate 2001 can be made of flexible materials such as polyimide or polyester. Each wiring layer can be made of metal materials such as copper, silver, aluminum, etc., or alloy materials thereof, and each insulation layer can be made of insulation materials such as polyimide or polyester, the grounded layer 2004 can be made of a metal material (such as a copper layer or a copper foil), and the shield layer 2006 includes an insulation base and a conductive material filled in the insulation base, for example, the insulation base is made of epoxy resin, and the filled conductive material is copper powder, graphite powder, etc.; alternatively, in some embodiments, the shield layer 2006 may also be made of a metal material, and the material of each functional layer is not specifically limited in the present disclosure. The adhesive layer may adopt epoxy resin, polyethylene, or the like.

For example, the third bridge end 201 and the fourth bridge end 202 of the bridge sub-circuit board 200 are respectively connected to the first bridge end 101 and the second bridge end 102 of the main sub-circuit board 100 through an anisotropic conductive adhesive, a solder material, or a connector. For example, the connector includes a zero insertion force (ZIF) connector or a board to board (BTB) connector, etc. The embodiments of the present disclosure do not specifically limit the connection method of the respective bridge ends.

For example, in one example, a board-to-board connector is used to connect the main sub-circuit board 100 and the bridge sub-circuit board 200. In this case, the connector includes a male connector and a female connector that match with each other. For example, the first bridge end 101 and the second bridge end 102 of the main sub-circuit board 100 are provided with female connectors, and the third bridge end 201 and the fourth bridge end 202 of the bridge sub-circuit board 200 are provided with male connectors, thereby connecting the bridge sub-circuit board 200 to the main sub-circuit board 100 through matching the male connectors and the female connectors.

The flexible printed circuit provided by the embodiments of the present disclosure has a main sub-circuit board and a bridge sub-circuit board, by bridge-connecting the wiring lines located on two sides of the main sub-circuit board through the bridge sub-circuit board, the wiring lines on the main sub-circuit board can be avoided from crossing, so that signal crosstalk can be prevented or reduced, or it is possible to avoid adding an additional functional layer to prevent signal crosstalk, thereby avoiding complexity of the circuit board structure. In some embodiments of the present disclosure, the main sub-circuit board and the bridge sub-circuit board have a simple single-layer or double-layer structure, so that the wiring layout is simpler, which can reduce the difficulty of manufacturing the main sub-circuit board and the bridge sub-circuit board.

Figure 10A:
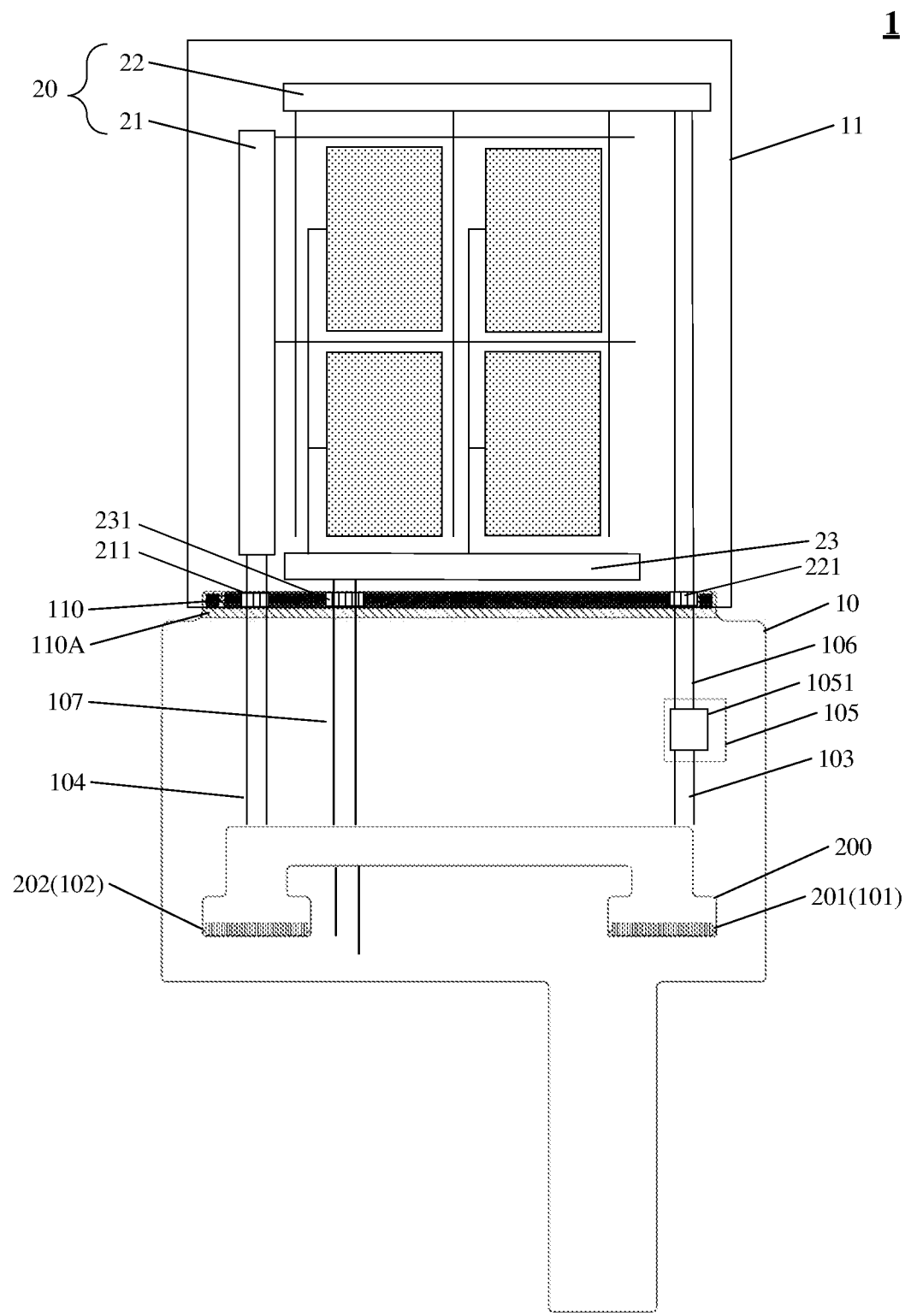
FIG. 10A is a schematic diagram of an electronic device module provided by at least one embodiment of the present disclosure.

Some embodiments of the present disclosure provide an electronic device module. FIG. 10A shows a schematic diagram of the electronic device module. As shown in FIG. 10A, the electronic device module 1 includes an electronic device substrate 11 and the flexible printed circuit 10 described in any one of the above embodiments, the electronic device substrate 11 includes a first functional circuit structure 20. The first functional wiring line of the flexible printed circuit 10 (including the first wiring portion 103, the second wiring portion 104, and the third wiring portion 203) is electrically connected to the first functional circuit structure 20.

For example, in some embodiments, the flexible printed circuit 10 further includes a second functional wiring line 106, the first functional circuit structure 20 includes a first signal transmission portion 21 and a second signal transmission portion 22, the first functional wiring line is electrically connected to the first signal transmission portion 21, and the second functional wiring line 106 is electrically connected to the second signal transmission portion 22.

For example, in some embodiments, the electronic device substrate 11 further includes a second functional circuit structure 23, and the flexible printed circuit further includes a third functional wiring line 107, and the third functional wiring line 107 is electrically connected to the second functional circuit structure 23.

For example, in some embodiments, the electronic device substrate 11 is a substrate having a display function and a touch function. In this case, the first functional circuit structure 20 is a touch circuit structure, and the second functional circuit structure 23 is a display circuit structure. In other embodiments, the electronic device substrate 11 is a substrate with a display function and a fingerprint recognition function, in this case, the first functional circuit structure 20 is a fingerprint recognition circuit structure, for example, the fingerprint recognition circuit structure is a capacitive fingerprint recognition circuit, the capacitive fingerprint recognition circuit includes detection drive electrodes and detection sensing electrodes arranged crosswise, and the second functional circuit structure 23 is a display circuit structure. The following embodiment is described by taking a case where the first functional circuit structure 20 is a touch circuit structure as an example.

For example, the manner in which the touch circuit structure is provided on the electronic device substrate 11 may be an in-cell type or an on-cell type. The form of the touch circuit structure may be a capacitive type, such as a mutual-capacitive touch circuit structure. For example, the mutual-capacitive touch circuit structure includes a plurality of first electrodes extending in a first direction and a plurality of second electrodes extending in a second direction (crossing the first direction), detection capacitors will be formed at positions where the two groups of electrodes cross, that is, the two groups of electrodes constitute the two electrodes of the capacitors. In a case where the finger touches the touch circuit structure, the finger affects the coupling state between the two electrodes near the touch point, thereby changing the capacitance of the detection capacitor formed by the two electrodes. According to the capacitance change data of the touch circuit structure and the coordinates of the respective capacitors, the coordinates of each touch point can be obtained. In a case of detecting the capacitance value of the capacitor, the horizontal electrodes serve as the touch driving circuit and sequentially send out excitation signals, and the vertical electrodes serve as the touch sensing circuit and receive signals simultaneously or sequentially, so that the capacitance values of all intersection points of the horizontal electrodes and the vertical electrodes, that is, the capacitance values of the two-dimensional plane of the entire touch structure, can be obtained. Therefore, even if there are a plurality of touch points on the touch circuit structure, the true coordinates of each touch point can be determined.

For example, in the above case, the first signal transmission portion 21 may include a touch driving wiring line electrically connected to a touch driving (Tx) circuit of the touch circuit structure, and the second signal transmission portion 22 may include a touch sensing wiring line electrically connected to a touch sensing (Rx) circuit of the touch circuit structure. In this case, the first control circuit 1051 is a touch driving IC, which can provide an excitation signal for the touch driving circuit through the touch driving wiring line, and can receive the sensing signal of the touch sensing circuit through the touch sensing wiring line, and can determine the touch position and responds based on the above signals. For example, in the above example, the touch driving circuit is bridge-connected, and the touch sensing circuit is directly electrically connected to the first control circuit combination structure 105, so that the distance between the touch sensing circuit and the first control circuit combination structure 105 is closer, i.e., the touch sensing circuit is closer to the first control circuit 1051 mounted on the first control circuit combination structure 105, namely, the distance between the touch sensing circuit and the touch driving IC is closer. Therefore, the transmission path for transmitting the sensing signal received by the touch sensing circuit to the touch driving IC is shorter, so that the sensing signal is less likely to be interfered by another signal, so that the touch operation can be more accurate. For example, as shown in FIG. 10A, the touch driving wiring line and the touch sensing wiring line extend to the same side of the electronic device substrate 11 (the lower side in the figure), and are respectively electrically connected to the contact pad 211 and the contact pad 221 formed on the side.

For example, in other embodiments of the present disclosure, the first signal transmission portion 21 may include a touch sensing wiring line electrically connected to a touch sensing (Rx) circuit of the touch circuit structure, and the second signal transmission portion 22 includes a touch driving wiring line electrically connected to a touch driving (Tx) circuit of the touch circuit structure, in this case, the touch sensing circuit is bridge-connected, and the touch driving circuit is directly electrically connected to the first control circuit combination structure 105, so that the distance between the touch driving circuit and the first control circuit combination structure 105 is closer, that is, the touch driving circuit is closer to the first control circuit 1051 mounted on the first control circuit combination structure 105, that is, the distance between the touch driving circuit and the touch driving IC is closer. Therefore, in the embodiment, the touch driving signal in the touch driving circuit is less likely to be interfered by another signal.

For example, the flexible printed circuit 10 has a wiring connection end 110 on one side (for example, the upper side in the figure) of the flexible printed circuit 10, the wiring connection end 110 has a plurality of contact pads, and the other ends of the plurality of wiring lines included in the second wiring portion 104 are electrically connected to part of the contact pads in the wiring connection end 110 in one-to-one correspondence, and the other ends of the plurality of wiring lines included in the second functional wiring line 106 are electrically connected to another part of the contact pads in the wiring connection end 110 in one-to-one correspondence, in addition, the other ends of the plurality of wiring lines included in the third functional wiring line 107 are electrically connected to further another part of the contact pads in the wiring connection end 110 in one-to-one correspondence. For example, contact pads electrically connected to the second wiring portion 104, contact pads electrically connected to the third functional wiring line 107, and contact pads electrically connected to the second functional wiring line 106 are arranged at intervals or continuously on the wiring connection end 110, which is not specifically limited in the embodiments of the present disclosure. For example, in a case where the number of wiring lines in the second wiring portion 104, the third functional wiring line 107, and the second functional wiring line 106 is large, the contact pads connected to these wiring lines may be continuously arranged on the wiring connection end 110; in a case where the number of wiring lines in the second wiring portion 104, the third functional wiring line 107, and the second functional wiring line 106 is small, the contact pads connected to these wiring lines may be arranged at intervals on the wiring connection end 110, and in this case, for example, a plurality of sets of contact pads arranged at intervals shown in FIG. 10A may be formed.

For example, the wiring connection end 110 is provided in a wiring connection region 110A of the main sub-circuit board (that is, the oblique line region below the wiring connection end 110 in the figure), for example, the wiring connection region 110A only has a wiring layer and a part of the insulation layer, and does not have the shield layer and other structures, therefore, the wiring connection region 110A has high transparency. In a case where the flexible printed circuit 10 is connected to the electronic device substrate 11, clear alignment can be achieved, so as to facilitate accurate electrical connection between the flexible printed circuit 10 and the electronic device substrate 11.

For example, in a case where the flexible printed circuit 10 is connected to the electronic device substrate 11, the contact pads of the wiring connection end 110 on the side of the flexible printed circuit 10 and the contact pads on the side of the electronic device substrate 11 may be directly pressure-connected together. For example, in some embodiments, the contact pads of the wiring connection end 110 on the side of the flexible printed circuit 10 and the contact pads on the side of the electronic device substrate 11 are electrically connected to each other by, for example, ACF, thereby electrically connecting the first functional wiring line on the flexible printed circuit 10 with the touch driving wiring line connected to the first signal transmission portion 21 through the contact pads 211, and electrically connecting the second functional wiring line on the flexible printed circuit 10 with the touch sensing wiring line connected to the second signal transmission portion 22 through the contact pads 221, as a result, the first functional wiring line and the second functional wiring line of the flexible printed circuit 10 are electrically connected to the touch circuit structure of the electronic device substrate 11.

For example, the second functional circuit structure 23, that is, the display circuit structure, includes a plurality of data lines (and also includes gate lines, etc.), the plurality of data lines are electrically connected to pixel units, respectively, and the plurality of data lines extend to one side (the lower side in the figure) of the electronic device substrate 11, and are electrically connected to the contact pads 231 formed on the side. In a case of an organic light-emitting diode (OLED) display substrate, the pixel unit includes a display driving circuit. For example, the display driving circuit includes a plurality of transistors, capacitors, light-emitting devices, and the like. For example, the display driving circuit is formed in various forms such as 2T1C, 3T1C, or 7T1C. For example, in a case where the flexible printed circuit 10 is connected to the electronic device substrate 11, the plurality of contact pads provided on the wiring connection end 110 of the flexible printed circuit 10 also electrically connect the third functional wiring line on the flexible printed circuit to the data lines 23 in the second functional circuit structure through the contact pads 231, thereby electrically connecting the third functional wiring line of the flexible printed circuit 10 to the display circuit structure of the electronic device substrate 11.

Figure 10B:
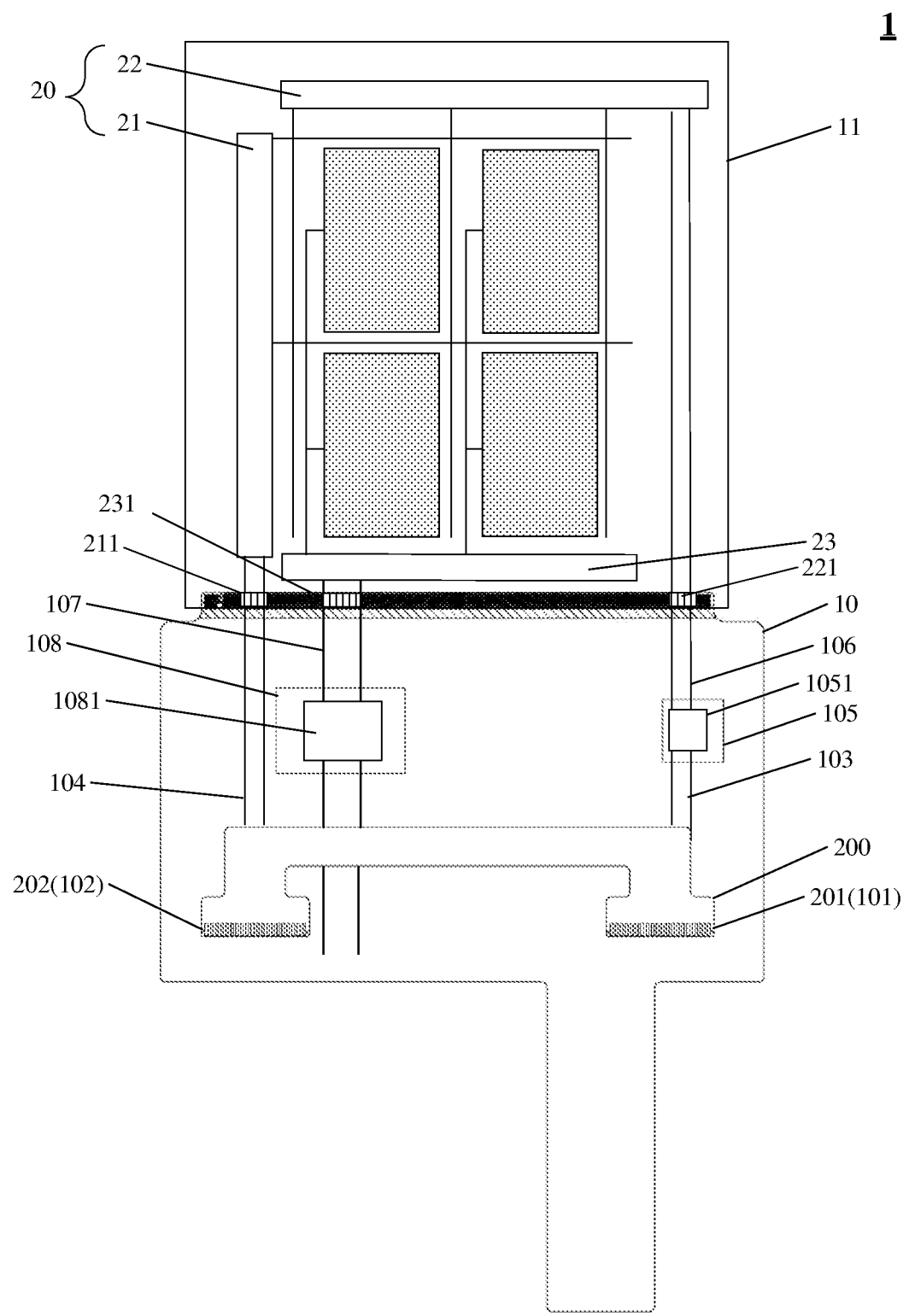
FIG. 10B is a schematic diagram of another electronic device module provided by at least one embodiment of the present disclosure.

For example, in some embodiments, as shown in FIG. 10B, the main sub-circuit board 100 may further have a second control circuit combination structure 108 and a second control circuit 1081 provided on the second control circuit combination structure 108. In this case, the second control circuit 1081 is a display driving IC, and the display driving IC can provide a data signal for the display driving circuit, so that a light-emitting state of the light-emitting device can be controlled by the data signal provided by the display driving IC to achieve different display effects.

In a case of a liquid crystal display (LCD) substrate, the pixel unit includes a switching element and a first electrode (pixel electrode) and a second electrode (common electrode) for controlling the deflection of the liquid crystal, and the switching element is electrically connected to the first electrode. The second functional circuit structure 23, that is, the display circuit structure, includes a plurality of data lines respectively connected to the pixel units. In this case, the second control circuit is a display driving IC, and the display driving IC can provide different data voltage signals to the pixel unit through the data line, thereby controlling the twisting state of the liquid crystal to achieve different display effects.

For example, the flexible printed circuit is connected to the electronic device substrate 11 by binding. During the binding process, the flexible printed circuit may be bent to the back of the electronic device substrate 11 and fixed after being bound to the electronic device substrate 11, that is, the flexible printed circuit is mounted on a non-display side of the electronic device substrate 11 in order to facilitate the large-screen design of the display screen.

In the flexible printed circuit of the electronic device substrate in some embodiments of the present disclosure described above, the wiring portions, which are respectively electrically connected to the touch driving circuit, on the main sub-circuit board are bridge-connected through the bridge sub-circuit board, so that the touch driving circuit and the display driving circuit do not intersect on the main sub-circuit board, and the touch driving circuit and the display driving circuit are also shielded from each other at the intersection position of the main sub-circuit board and the bridge sub-circuit board, and therefore the signal crosstalk between the wiring lines in the main sub-circuit board and the wiring lines in the bridge sub-circuit board can be avoided, at the same time, the structure of the main sub-circuit board and the structure of the bridge sub-circuit board are simple, and the wiring layout is simple, which is beneficial to simplify the manufacturing process of the flexible printed circuit.

Figure 11:
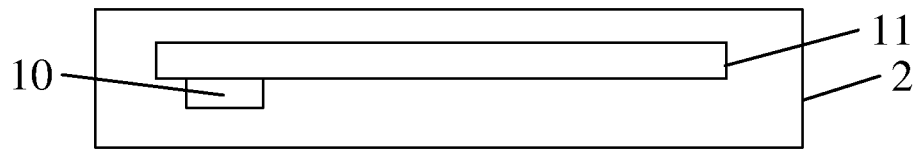
FIG. 11 is a schematic diagram of an electronic device provided by some embodiments of the present disclosure.

At least one embodiment of the present disclosure provides an electronic device. FIG. 11 shows a schematic diagram of the electronic device. As shown in FIG. 11, the electronic device 2 includes any one of the above electronic device modules. The electronic device module includes an electronic device substrate 11 and a flexible printed circuit 10. For example, an upper side of the electronic device substrate 11 shown in FIG. 11 is a display side, and a lower side is a non-display side; in this case, the flexible printed circuit 10 is bent and placed on the non-display side of the electronic device substrate 11 after being bound to the electronic device substrate 11, so as to achieve the large-screen design of the display screen.

The electronic device 2 may be, for example, any product or component with a display function such as a mobile phone, a tablet computer, a TV, a display, a notebook computer, a digital photo frame, a navigator, etc. The embodiments of the present disclosure are not limited in this aspect.

Figure 12:
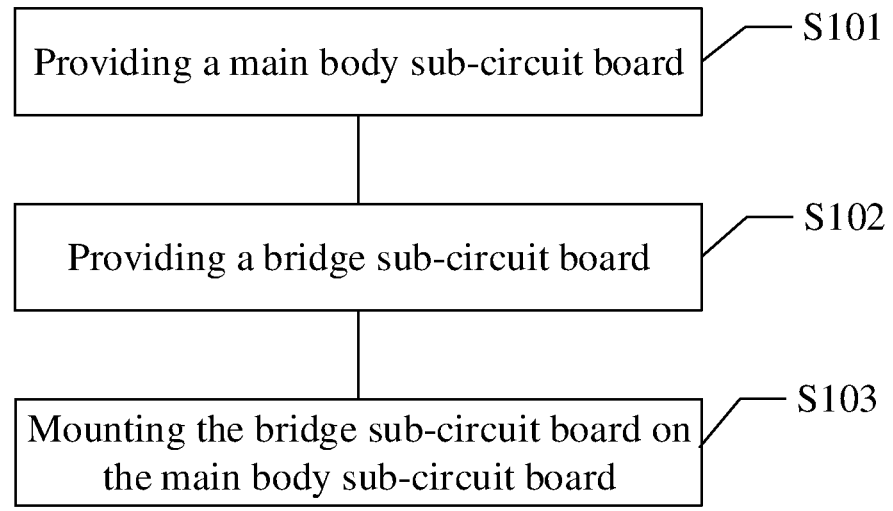
FIG. 12 is a flowchart of manufacturing a flexible printed circuit provided by some embodiments of the present disclosure.

Some embodiments of the present disclosure provide a manufacturing method for a flexible printed circuit. As shown in FIG. 12, the manufacturing method includes steps S101-S103.

Step S101: providing a main sub-circuit board.

Referring to FIG. 2, the main sub-circuit board 100 includes a first bridge end 101, a second bridge end 102, a first wiring portion 103, and a second wiring portion 104. The first wiring portion 103 and the second wiring portion 104 are spaced apart from each other and are electrically connected to the first bridge end 101 and the second bridge end 102, respectively.

For example, referring to FIG. 6A, the main sub-circuit board 100 is formed by sequentially forming a first wiring layer 1002 and a first insulation layer 1003 on the first substrate 1001. For example, the first substrate 1001 is made of materials such as polyimide or polyester, the first wiring layer 1002 is made of metal materials such as copper, silver, aluminum, etc., or alloy materials thereof, and the first insulation layer 1003 is also made of materials such as polyimide or polyester. For example, firstly, a copper metal layer is formed on the first substrate 1001 by sputtering or the like, secondly, the copper metal layer is patterned to form the first wiring layer 1002, and then a first insulation layer 1003 is formed on the first wiring layer 1002 by coating or the like, and an opening is formed in the first insulation layer 1003 to form a structure such as a bridge end.

Step S102: providing a bridge sub-circuit board.

Referring to FIG. 3, the bridge sub-circuit board 200 includes a third bridge end 201, a fourth bridge end 202, and a third wiring portion 203, and the third bridge end 201 and the fourth bridge end 202 are electrically connected by the third wiring portion 203.

For example, referring to FIG. 8A, the bridge sub-circuit board 200 is formed by sequentially forming a first bridge wiring layer 2002 and a first bridge insulation layer 2003 on a first side of the second substrate 2001. For example, the first substrate 2001 is made of materials such as polyimide or polyester, the first bridge wiring layer 2002 is made of metal materials, such as copper, silver, aluminum, or alloy materials thereof, and the first bridge insulation layer 2003 is also made of materials such as polyimide or polyester. For example, firstly, a copper metal layer is formed on the second substrate 2001 by sputtering or the like, then the copper metal layer is patterned to form the first bridge wiring layer 2002, and then a first bridge insulation layer 2003 is formed on the first bridge wiring layer 2002 by coating or the like.

For example, referring to FIG. 8C, in some embodiments, forming the bridge sub-circuit board 200 further includes sequentially forming a second bridge wiring layer 2004 and a second bridge insulation layer on a second side of the second substrate 2001 opposite to the first side 2005. For example, the second bridge wiring layer 2004 may be a (electrically) grounded layer, and is made of copper or other materials, and the second bridge insulation layer 2005 is made of materials such as polyimide or polyester. For example, openings (or via holes) are formed in the second substrate 2001 and the second bridge insulation layer 2005 by patterning, etc., the third wiring portion 203 formed on the first side of the bridge sub-circuit board 200 is exposed and led out through the via hole 2011 in the second substrate 2001 and the opening 2015 in the second bridge insulation layer 2005, and for example, the third wiring portion 203 is surface-treated to form a plurality of contact pads, thereby constituting the bridge end.

For example, referring to FIG. 8C, in some embodiments, forming the bridge sub-circuit board 200 further includes forming a shield layer 2006 on the second side of the second substrate 2001. For example, the shield layer 2006 is suspended, or is configured to be electrically connected to a ground line.

For example, in some embodiments, as shown in FIG. 8D, in a case where the second bridge wiring layer 2004 is a grounded layer, an opening 2025 is further formed in the second bridge insulation layer 2005, and the shield layer 2006 is connected to the ground line in the second bridge wiring layer 2004 through the opening 2025.

For example, in a case where the second bridge wiring layer 2004 is a grounded layer, the grounded layer 2004 and the shield layer 2006 can achieve a double shielding effect, thereby preventing signal crosstalk generated between each wiring line on the main sub-circuit board 100 and each wiring line on the bridge sub-circuit board 200. For example, the shield layer 2006 is formed with a hollow structure 2016 at a position corresponding to the opening 2015 of the second bridge insulation layer 2005, thereby exposing the bridge end.

For example, the shield layer 2006 includes an insulation base and a conductive material filled in the insulation base, for example, the insulation base is made of epoxy resin, and the filled conductive material is copper powder, graphite powder, etc.; alternatively, in some embodiments, the shield layer 2006 may also be made of a metal material, and the embodiments of the present disclosure do not specifically limit this. For example, the shield layer may be directly attached to the second side of the bridge sub-circuit board 200 after being formed.

Step S103: mounting the bridge sub-circuit board on the main sub-circuit board.

Referring to FIG. 1A, the third bridge end 201 and the fourth bridge end 202 of the bridge sub-circuit board 200 are electrically connected to the first bridge end 101 and the second bridge end 102 of the main sub-circuit board 100, respectively, so that the bridge sub-circuit board 200 is mounted on the main sub-circuit board 100, and the first wiring portion 103, the third wiring portion 203, and the second wiring portion 104 are electrically connected in sequence to obtain a first functional wiring line. During the mounting process, the second side of the bridge sub-circuit board 200 is closer to the main sub-circuit board 100 than the first side of the bridge sub-circuit board 200, so that the wiring lines on the main sub-circuit board 100 and the wiring lines on the bridge sub-circuit board 200 can be shielded by the grounded layer 2004 and the shield layer 2006 to prevent signal crosstalk.

For example, the third bridge end 201 and the fourth bridge end 202 of the bridge sub-circuit board 200 can be respectively connected to the first bridge end 101 and the second bridge end 102 of the main sub-circuit board 100 by a hot pressing method, a welding method, or through a connector. For example, in the hot pressing method, an anisotropic conductive adhesive is formed between the two bridge ends, and then the bridge ends are hot pressed, so as to connect the two bridge ends together through the anisotropic conductive adhesive. For example, the connector includes a zero insertion force (ZIF) connector or a board to board (BTB) connector, etc. The embodiments of the present disclosure do not specifically limit the connection method.

For example, in one example, a board-to-board connector is used to connect the main sub-circuit board 100 and the bridge sub-circuit board 200. In this case, the connector includes a male connector and a female connector that match with each other. For example, the first bridge end 101 and the second bridge end 102 of the main sub-circuit board 100 are provided with female connectors, and the third bridge end 201 and the fourth bridge end 202 of the bridge sub-circuit board 200 are provided with male connectors, thereby connecting the bridge sub-circuit board 200 to the main sub-circuit board 100 through matching the male connectors and the female connectors.

The manufacturing method for the flexible printed circuit of the embodiments of the present disclosure provides a main sub-circuit board and a bridge sub-circuit board, by bridge-connecting the wiring lines located on two sides of the main sub-circuit board through the bridge sub-circuit board, the method can avoid the wiring lines on the main sub-circuit board from crossing, prevent or reduce signal crosstalk, or it is possible to avoid adding an additional functional layer to prevent signal crosstalk, thereby avoiding complexity of the circuit board structure. In addition, the main sub-circuit board and the bridge sub-circuit board provided by the manufacturing method have a simple single-layer or double-layer structure, so that the wiring layout is simpler, which can reduce the difficulty of manufacturing the main sub-circuit board and the bridge sub-circuit board.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or narrowed, that is, the drawings are not drawn in a real scale. However, it should understood that, in the case in which a component such as a layer, film, region, substrate or the like is referred to be "on" or "under" another component, the component may be directly on or under another component or there may be an intermediate component.

(3) In case of no conflict, the embodiments of the present disclosure and the features in the embodiments can be combined with each other to obtain new embodiments.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

What is claimed is:

1. A flexible printed circuit, comprising:
    a main sub-circuit board, comprising a first substrate, and a first bridge end, a second bridge end, a first wiring portion, and a second wiring portion on the first substrate, wherein the first wiring portion and the second wiring portion are spaced apart from each other and are electrically connected to the first bridge end and the second bridge end, respectively; and
    a bridge sub-circuit board, comprising a second substrate, and a third bridge end, a fourth bridge end, and a third wiring portion for a first functional wiring line on the second substrate, wherein the third bridge end and the fourth bridge end are electrically connected by the third wiring portion,
    wherein the first substrate and the second substrate are not in direct contact, and the bridge sub-circuit board is configured to be mounted on the main sub-circuit board by electrically connecting the third bridge end and the fourth bridge end to the first bridge end and the second bridge end, respectively; the flexible printed circuit further comprises a second functional wiring line, the flexible printed circuit is connected to an electronic device substrate, the electronic device substrate comprises a first functional circuit structure, the first functional circuit structure comprises a first signal transmission portion and a second signal transmission portion, the first functional wiring line is electrically connected to the first signal transmission portion, and the second functional wiring line is electrically connected to the second signal transmission portion.

2. The flexible printed circuit according to claim 1, wherein the bridge sub-circuit board is mounted on the main sub-circuit board, and the first wiring portion, the third wiring portion, and the second wiring portion are electrically connected in sequence to obtain the first functional wiring line.

3. The flexible printed circuit according to claim 1, further comprising a first control circuit combination structure, wherein the first control circuit combination structure is on the main sub-circuit board and is electrically connected to the first wiring portion, or the first control circuit combination structure is on the bridge sub-circuit board and is electrically connected to the third wiring portion;
    the first control circuit combination structure is configured to provide a first electrical signal to the first functional wiring line or receive a first electrical signal from the first functional wiring line.

4. The flexible printed circuit according to claim 3, wherein the second functional wiring line is provided on the main sub-circuit board,
    the second functional wiring line is electrically connected to the first control circuit combination structure on the main sub-circuit board, and the first control circuit combination structure is further configured to provide a second electrical signal to the second functional wiring line or receive a second electrical signal from the second functional wiring line.

5. The flexible printed circuit according to claim 4, wherein the main sub-circuit board further comprises a third functional wiring line, and
the third functional wiring line is between the first wiring portion and the second wiring portion, and crosses the bridge sub-circuit board mounted on the main sub-circuit board;
the first wiring portion, the second wiring portion, and the third functional wiring line are routed in a same direction.

6. The flexible printed circuit according to claim 1, wherein the main sub-circuit board comprises a first main wiring layer on a first side of the first substrate and a first main insulation layer stacked on a side of the first main wiring layer away from the first substrate,
the first main wiring layer comprises the first wiring portion, the second wiring portion, the first bridge end, and the second bridge end, and
the first bridge end and the second bridge end are exposed by the first main insulation layer.

7. The flexible printed circuit according to claim 6, wherein the main sub-circuit board further comprises a second main wiring layer, on a second side of the first substrate opposite to the first side, and a second main insulation layer stacked on a side of the second main wiring layer away from the first substrate, and
the second main wiring layer comprises the first wiring portion and the second wiring portion.

8. The flexible printed circuit according to claim 1, wherein the main sub-circuit board comprises a first main wiring layer on a first side of the first substrate and a first main insulation layer stacked on a side of the first main wiring layer away from the first substrate,
the main sub-circuit board further comprises a second main wiring layer, on a second side of the first substrate opposite to the first side, and a second main insulation layer stacked on a side of the second main wiring layer away from the first substrate,
the first main wiring layer comprises the first wiring portion, the second wiring portion, and the first bridge end, and the first bridge end is exposed by the first main insulation layer; the second main wiring layer comprises the first wiring portion, the second wiring portion, and the second bridge end, and the second bridge end is exposed by the second main insulation layer.

9. The flexible printed circuit according to claim 1, wherein the bridge sub-circuit board comprises a first bridge wiring layer on a first side of the second substrate and a first bridge insulation layer stacked on a side of the first bridge wiring layer away from the second substrate, and
the first bridge wiring layer comprises the third wiring portion.

10. The flexible printed circuit according to claim 9, wherein the bridge sub-circuit board further comprises a grounded layer on a second side of the second substrate opposite to the first side, and
in a case where the bridge sub-circuit board is mounted on the main sub-circuit board, the second side is closer to the main sub-circuit board than the first side.

11. The flexible printed circuit according to claim 10, wherein the bridge sub-circuit board further comprises a shield layer on the second side of the second substrate, and the shield layer is stacked on a side of the grounded layer away from the second substrate.

12. The flexible printed circuit according to claim 9, wherein the bridge sub-circuit board further comprises a second bridge wiring layer on a second side of the second substrate opposite to the first side, and a second bridge insulation layer stacked on a side of the second bridge wiring layer away from the second substrate,
the second bridge wiring layer comprises the third wiring portion, the third bridge end, and the fourth bridge end, the third bridge end and the fourth bridge end are exposed by the second bridge insulation layer; and
in a case where the bridge sub-circuit board is mounted on the main sub-circuit board, the second side is closer to the main sub-circuit board than the first side.

13. The flexible printed circuit according to claim 12, wherein the bridge sub-circuit board further comprises a shield layer on the second side of the second substrate and stacked on a side of the second bridge insulation layer away from the second substrate.

14. The flexible printed circuit according to claim 9, wherein the bridge sub-circuit board further comprises a second bridge wiring layer on a second side of the second substrate opposite to the first side, and a second bridge insulation layer stacked on a side of the second bridge wiring layer away from the second substrate,
the first bridge wiring layer further comprises the third bridge end, and the third bridge end is exposed by the first bridge insulation layer; and
the second bridge wiring layer comprises the third wiring portion and the fourth bridge end, and the fourth bridge end is exposed by the second bridge insulation layer.

15. The flexible printed circuit according to claim 1, wherein the third bridge end and the fourth bridge end of the bridging sub-circuit board are respectively connected to the first bridge end and the second bridge end of the main sub-circuit board through an anisotropic conductive adhesive, a solder material, or a connector.

16. The flexible printed circuit according to claim 1, wherein the main sub-circuit board comprises a plurality of first bridge ends and a plurality of second bridge ends; the flexible printed circuit comprises a plurality of bridge sub-circuit boards, and the plurality of bridge sub-circuit boards are mounted on the main sub-circuit board by electrically connecting a plurality of third bridge ends and a plurality of fourth bridge ends to the plurality of first bridge ends and the plurality of second bridge ends, respectively.

17. An electronic device module, comprising:
an electronic device substrate, and
the flexible printed circuit according to claim 1, wherein the electronic device substrate comprises the first functional circuit structure.

18. The electronic device module according to claim 17, wherein
the electronic device substrate further comprises a second functional circuit structure, and the flexible printed circuit further comprises a third functional wiring line, and the third functional wiring line is electrically connected to the second functional circuit structure.

19. The electronic device module according to claim 18, wherein the first functional circuit structure is a touch circuit structure, and the second functional circuit structure is a display circuit structure; and
the first signal transmission portion is a touch driving circuit of the touch circuit structure, and the second signal transmission portion is a touch sensing circuit of the touch circuit structure; or the first signal transmission portion is a touch sensing circuit of the touch circuit structure, and the second signal transmission portion is a touch driving circuit of the touch circuit structure.

20. A manufacturing method for a flexible printed circuit, comprising:
- providing a main sub-circuit board, wherein the main sub-circuit board comprises a first substrate, and a first bridge end, a second bridge end, a first wiring portion, and a second wiring portion on the first substrate, the first wiring portion and the second wiring portion are spaced apart from each other and are electrically connected to the first bridge end and the second bridge end, respectively;
- providing a bridge sub-circuit board, wherein the bridge sub-circuit board comprises a second substrate, and a third bridge end, a fourth bridge end, and a third wiring portion for a first functional wiring line on the second substrate, the third bridge end and the fourth bridge end are electrically connected by the third wiring portion; and
- electrically connecting the third bridge end and the fourth bridge end of the bridge sub-circuit board to the first bridge end and the second bridge end of the main sub-circuit board, respectively, so that the bridge sub-circuit board is mounted on the main sub-circuit board, and the first substrate and the second substrate are not in direct contact; wherein the manufacturing method further comprises: providing a second functional wiring line, and connecting the flexible printed circuit to an electronic device substrate, wherein the electronic device substrate comprises a first functional circuit structure, the first functional circuit structure comprises a first signal transmission portion and a second signal transmission portion, the first functional wiring line is electrically connected to the first signal transmission portion, and the second functional wiring line is electrically connected to the second signal transmission portion.

* * * * *